United States Patent
Di Vincenzo et al.

(10) Patent No.: US 10,373,681 B2
(45) Date of Patent: Aug. 6, 2019

(54) METHODS AND APPARATUSES HAVING A VOLTAGE GENERATOR WITH AN ADJUSTABLE VOLTAGE DROP FOR REPRESENTING A VOLTAGE DROP OF A MEMORY CELL AND/OR A CURRENT MIRROR CIRCUIT AND REPLICA CIRCUIT

(71) Applicant: Micron Technology, Inc., Boise, ID (US)

(72) Inventors: Umberto Di Vincenzo, Capriate San Gervasio (IT); Simone Lombardo, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/670,920

(22) Filed: Aug. 7, 2017

(65) Prior Publication Data

US 2017/0352417 A1    Dec. 7, 2017

Related U.S. Application Data

(60) Division of application No. 15/054,984, filed on Feb. 26, 2016, now Pat. No. 9,728,256, which is a continuation of application No. 13/800,622, filed on Mar. 13, 2013, now Pat. No. 9,281,061.

(60) Provisional application No. 61/703,168, filed on Sep. 19, 2012.

(51) Int. Cl.
*G11C 13/00* (2006.01)
*G11C 11/56* (2006.01)

(52) U.S. Cl.
CPC ...... *G11C 13/0069* (2013.01); *G11C 11/5678* (2013.01); *G11C 13/0004* (2013.01); *G11C 13/0023* (2013.01); *G11C 13/0038* (2013.01); *G11C 2211/5645* (2013.01); *G11C 2213/72* (2013.01)

(58) Field of Classification Search
CPC ............ G11C 13/0069; G11C 11/5678; G11C 13/0023; G11C 13/0038
USPC ........................................................ 365/163
See application file for complete search history.

(56) References Cited

U.S. PATENT DOCUMENTS

| | | | |
|---|---|---|---|
| 7,085,154 B2 | 8/2006 | Cho et al. | |
| 7,180,767 B2 | 2/2007 | Chen et al. | |
| 7,423,898 B2 | 9/2008 | Tanizaki et al. | |
| 7,492,637 B2 | 2/2009 | Kim et al. | |
| 7,571,901 B2* | 8/2009 | Philipp | G11C 11/5678 365/163 |
| 7,778,064 B2* | 8/2010 | Parkinson | G11C 13/0004 365/148 |

(Continued)

*Primary Examiner* — Tri M Hoang
(74) *Attorney, Agent, or Firm* — Holland & Hart LLP

(57) ABSTRACT

Apparatus and methods utilize a replica circuit to generate a voltage for programming of a memory cell, such as a memory cell of a phase-change memory (PCM). Current passing through a circuit including the memory cell to be programmed is mirrored in a scaled or unscaled manner, and provided as an input to the replica circuit. The replica circuit represents voltage drops that should be encountered when programming the memory cell. An input voltage is also provided to the replica circuit, which affects the voltage drop within the replica circuit that represents the voltage drop of the cell. The voltage drop across the replica circuit can then be mirrored and provided to bias the circuit including the memory cell.

6 Claims, 18 Drawing Sheets

(56) References Cited

U.S. PATENT DOCUMENTS

| | | |
|---|---|---|
| 7,787,281 B2 * | 8/2010 | Sheu ............... G11C 11/5678 365/148 |
| 7,920,407 B2 | 4/2011 | Chen et al. |
| 7,974,122 B2 | 7/2011 | Lin et al. |
| 8,077,506 B2 | 12/2011 | Lee et al. |
| 8,243,520 B2 | 8/2012 | Chan et al. |
| 8,441,847 B2 | 5/2013 | Eleftheriou et al. |
| 8,456,887 B2 | 6/2013 | Iwata |
| 8,553,453 B2 * | 10/2013 | Pellizzer ............... G11C 11/56 365/163 |
| 8,605,517 B2 | 12/2013 | Choi |
| 8,625,329 B2 | 1/2014 | Maejima |
| 2012/0230081 A1 | 9/2012 | Close et al. |

\* cited by examiner

METHODS AND APPARATUSES HAVING A VOLTAGE GENERATOR WITH AN ADJUSTABLE VOLTAGE DROP FOR REPRESENTING A VOLTAGE DROP OF A MEMORY CELL AND/OR A CURRENT MIRROR CIRCUIT AND REPLICA CIRCUIT

CROSS-REFERENCE TO RELATED APPLICATION

The present Application for Patent is a divisional of U.S. patent application Ser. No. 15/054,984 by Di Vincenzo et al., entitled "Methods and Apparatuses Having a Voltage Generator with an Adjustable Voltage Drop for Representing a Voltage Drop of a Memory Cell and/or A Current Mirror Circuit and Replica Circuit," filed Feb. 26, 2016, now U.S. Pat. No. 9,728,256, issued on Aug. 8, 2017, which is a continuation of U.S. patent application Ser. No. 13/800,622 by Di Vincenzo et al., entitled "Methods and Apparatuses Having a Voltage Generator with an Adjustable Voltage Drop for Representing a Voltage Drop of a Memory Cell and/or a Current Mirror Circuit and Replica Circuit," filed Mar. 13, 2013, now U.S. Pat. No. 9,281,061, issued on Mar. 8, 2016, which claims priority to U.S. Provisional Patent Application No. 61/703,168 by Di Vincenzo et al., entitled "Voltage-Mode Programming Technique for Phase-Change Memory," filed Sep. 19, 2012, assigned to the assignee hereof, and each of which is expressly incorporated by reference in its entirety herein.

BACKGROUND

Field of the Invention

Embodiments of the invention generally relate to electronics, and in particular, to apparatuses that include memory cells such as phase-change memory (PCM) cells.

Description of the Related Art

Phase-change memory (PCM), also known as PCRAM or PRAM, is a form of nonvolatile memory made from a phase-change material. An example of a phase-change material is Germanium-Antimony-Tellurium (GST). When a cell of GST material is heated beyond its melting point and cools relatively rapidly, the phase-change material of the cell is in an amorphous state and can have a resistance associated with a first state, such as logic 0. When the cell of GST material is heated and is cooled relatively slowly, the phase-change material of the cell is in a crystalline state and can have a resistance associated with a second state, such as logic 1. The cell of GST material can also be heated to a relatively lower temperature, such as a temperature associated with crystallization to achieve the crystalline state. Intermediate states are also possible for multi-level cells.

For relatively good density and low cost, the individual cells of a memory device will be small. However, perfect uniformity during production is not practical, and even relatively small differences in size can result in a relatively large amount of variability in the appropriate amount of power that should be used to heat a cell. In addition, other sources of variability exist. Some sources of variability can affect an entire array of cells. While it is possible to compensate for some sources of variability by a calibration procedure performed during manufacturing, such procedures tend to be time consuming, which can increase the cost of production.

BRIEF DESCRIPTION OF THE DRAWINGS

These drawings and the associated description herein are provided to illustrate specific embodiments of the invention and are not intended to be limiting.

To avoid repetition of description, components having the same or similar function may be referenced by the same reference number.

DETAILED DESCRIPTION OF THE SPECIFIC EMBODIMENTS

Although particular embodiments are described herein, other embodiments of the invention, including embodiments that do not provide all of the benefits and features set forth herein, will be apparent to those of ordinary skill in the art.

A phase-change memory cell can have a programmable element having a state that is crystalline, amorphous, or in-between. While described in the context of a single-level PCM cell with only a crystalline or an amorphous state, the principles and advantages described herein are also applicable to multi-level cells programmable to a target data state of a plurality of potential data states, including cells programmable to states which are partially crystalline and partially amorphous. While illustrated in the context of phase change memory, the principles and advantages described herein are applicable to other types of memories including those in existence and those yet to be developed.

There are two fundamental modes for electrically setting a state of a PCM cell. A typical PCM memory device will utilize only one of these modes. The first technique is known as voltage mode and the second technique is known as current mode. In the voltage mode, a relatively constant voltage is applied to a cell via, for example, column and row decoders, such that the cell melts, and then the voltage is ramped down. When the voltage is ramped down relatively slowly (small slope), the state of the PCM cell is crystalline (typically logic 1). When the voltage is ramped down relatively quickly (large slope), the state of the PCM cell is amorphous (typically logic 0). In one non-limiting example, a slope smaller than 1 volt (V) per 20 nanoseconds (ns) can result in a crystalline state (typically logic 1) and a slope larger than 1V per 20 ns can result in an amorphous state.

Similarly, in the current mode, a relatively constant current is applied to the cell such that the cell melts, and then the current is ramped down. The slope of the ramp down determines the state of the PCM cell. Generally, the voltage mode is more favorable than the current mode because of mismatches in PCM cell geometry. These mismatches can cause variations in current density when the current mode is used. However, in the voltage mode, these cell geometry mismatches typically do not give rise to variations in current density. Thus, the voltage mode can be more favorable than the current mode, and PCM devices typically use the voltage mode.

Figure 1:
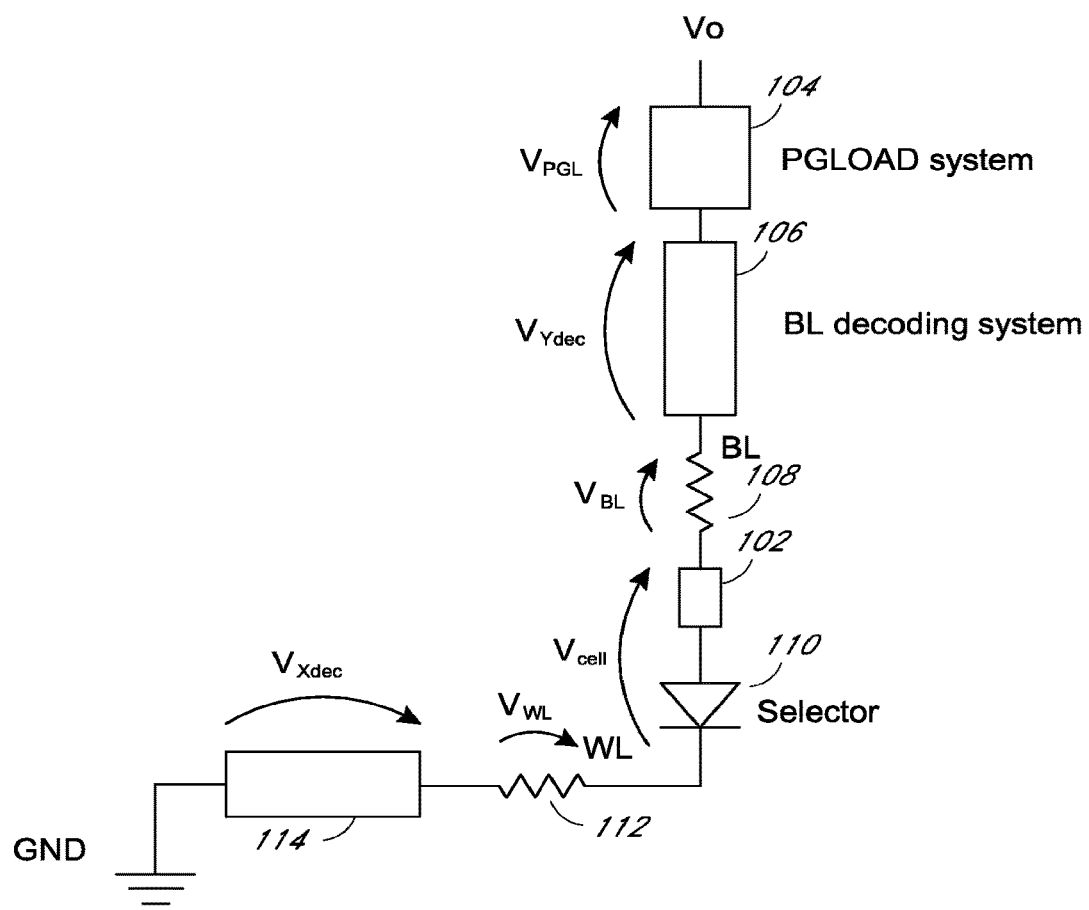
FIG. 1 illustrates voltage drops that can be encountered when setting a state for a phase change memory (PCM) cell.

FIG. 1 illustrates voltage drops that can be encountered when programming (e.g., setting) a state of a PCM cell in the voltage mode. In the illustrated example, the PCM cell is part of an array or tile and is accessed via column and row decoders. The programming path starts with a programming voltage $V_o$, has a drop $V_{PGL}$ across a modulator (e.g., PGLOAD system) 104, a drop $V_{Ydec}$ across a column (e.g., bit line) decoder 106, a drop $V_{BL}$ across the resistance of the bit line 108, a drop $V_{cell}$ across the PCM cell (e.g., including programmable element 102 and a selector 110), a drop VwL across the resistance of the word line 112, and a drop Vxdec across a row (e.g., word line) decoder 114. The modulator 104 can be used by multiple bit lines and can be considered to be outside of the array. While a diode is shown in FIG. 1 for the selector 110, other devices can alternatively be used for the selector 110, such as, but not limited to, a metal oxide semiconductor field effect transistor (MOSFET) or insulated gate field effect transistor (IGFET) or a bipolar junction transistor (BJT) can alternatively be used. The field-effect transistors (FETs) or "transistors" described herein can correspond to transistors known as metal-oxide-semiconductor field-effect transistors (MOSFETs). While the terms "metal" and "oxide" are present in the name of the device, it will be understood that these transistors can have gates made out of materials other than metals, such as polycrystalline silicon, and can have dielectric "oxide" regions made from dielectrics other than silicon oxide, such as from silicon nitride or high-k dielectrics.

A programming voltage Vo in an illustrative embodiment can be a relatively constant voltage used for melting the PCM cell. The modulator 104 can generate a voltage drop in a relatively fast ramped manner, for example, for ramping down the voltage applied to the PCM cell. As will be described later in connection with FIG. 14, one embodiment of the modulator 104 has at least a first mode and a second mode of operation, wherein in the first mode, the modulator 104 is configured to provide a short circuit between the first node and the second node, and wherein in the second mode, the modulator is configured to generate a voltage drop in a ramped manner between the first node and the second node in response to a ramped signal. While the drop $V_{cell}$ is the voltage drop of interest, it is typically not directly observable. It would be impractical to monitor the drop $V_{cell}$ directly for each PCM cell because of the number PCM cells.

The other voltage drops can be appreciable and can thus affect the voltage drop $V_{cell}$ across the PCM cell. For example, in one embodiment, the voltage drops $V_{Ydec}$ and $V_{xdec}$ can be about half of the programming voltage $V_o$. In addition, the PCM cell is subject to cell geometry variability during manufacture, which affects the drop $V_{cell}$. Further, the other voltage drops can vary over temperature, process variation, and the particular position of the PCM cell within an array. For example, the position of a particular cell can greatly affect the amount of resistance of the word line 112 for that particular cell.

Figure 2:
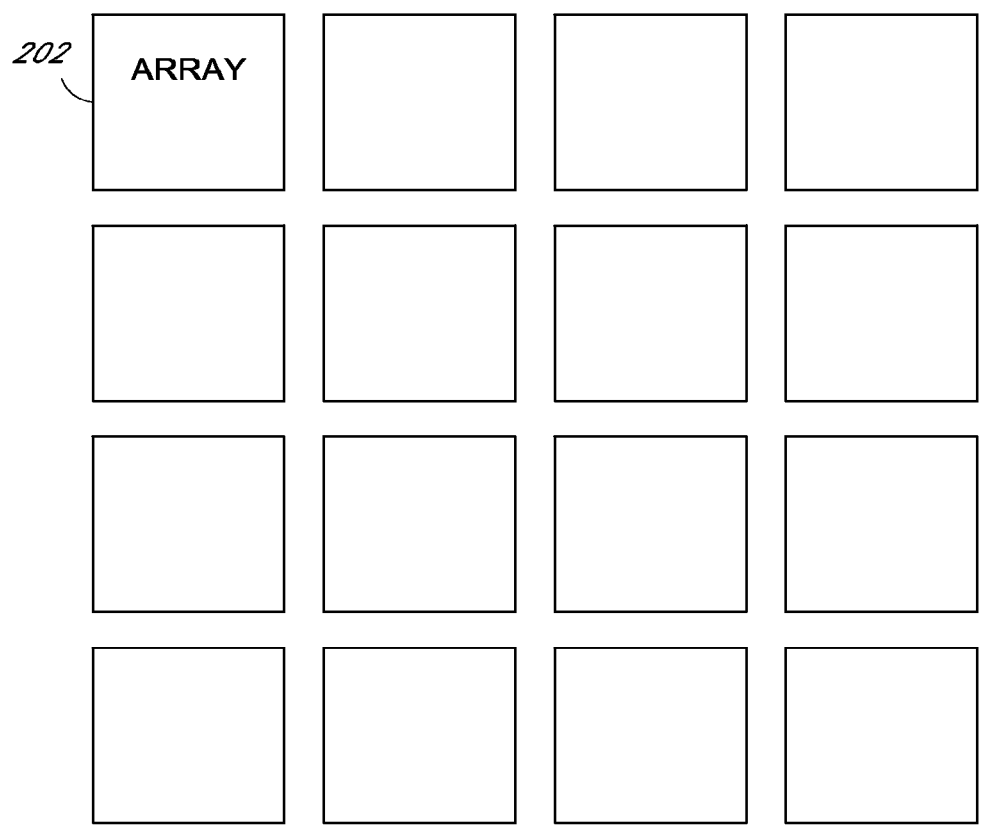
FIG. 2 illustrates an example of a matrix of arrays of PCM cells.

FIG. 2 illustrates an example of a matrix of arrays of PCM cells. The arrays can be arranged in a tile-like manner and can be referred to as tiles. The terms array and tile are synonymous, and the term "array" will be used from this point forward. Typically, relatively many PCM cells are arranged in an array 202, and relatively many arrays are arranged into a matrix for reading or writing in parallel and/or increasing the number of memory cells in a memory device. While 16 arrays are shown in the illustrated matrix, the number of arrays can vary in a broad range, and the matrix itself can be considered an array. There can be variation among the cells of the arrays.

Figure 3:
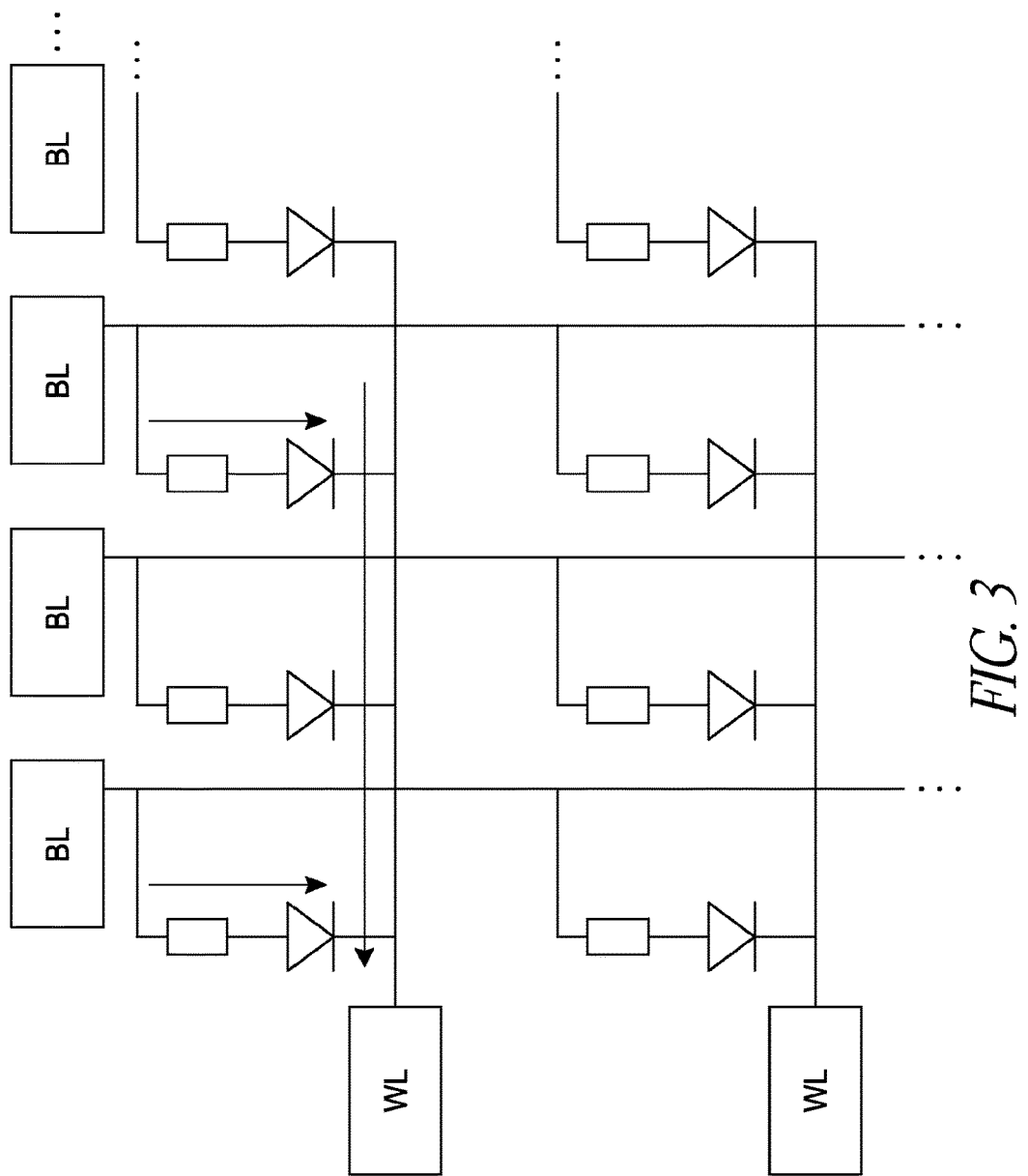
FIG. 3 illustrates a portion of an array.

FIG. 3 illustrates a portion of the array 202. The array 202 has relatively many bit lines (BL) and word lines (WL). For example, the number of bit lines and word lines can be in the many thousands per array. To access a particular cell, at least the bit line and word line corresponding to that cell are activated (e.g., depending on the associated logic, a line could be either active high or active low). Two or more PCM cells of a word line can also be programmed in parallel. The activation of more than one PCM cell per word line further increases the uncertainty in the voltage drops associated with the word lines, such as resistive voltage drops. In addition, the resistance of the cell itself can change during a programming operation, which can then disturb the programming of other cells tied to the same word line. Thus, it can be difficult to determine a relatively good programming voltage $V_o$ to use. A manufacturer can spend a great deal of time selecting a level for the programming voltage $V_o$ during the testing of a chip. However, due to the variability discussed above, the programming voltage Vo will likely be good for only some of the cells, which can reduce yield, thereby increasing cost. In addition, time consuming operations, such as those used during manufacturing test to find a relatively good programming voltage $V_o$, can increase the production cost.

Figure 4:
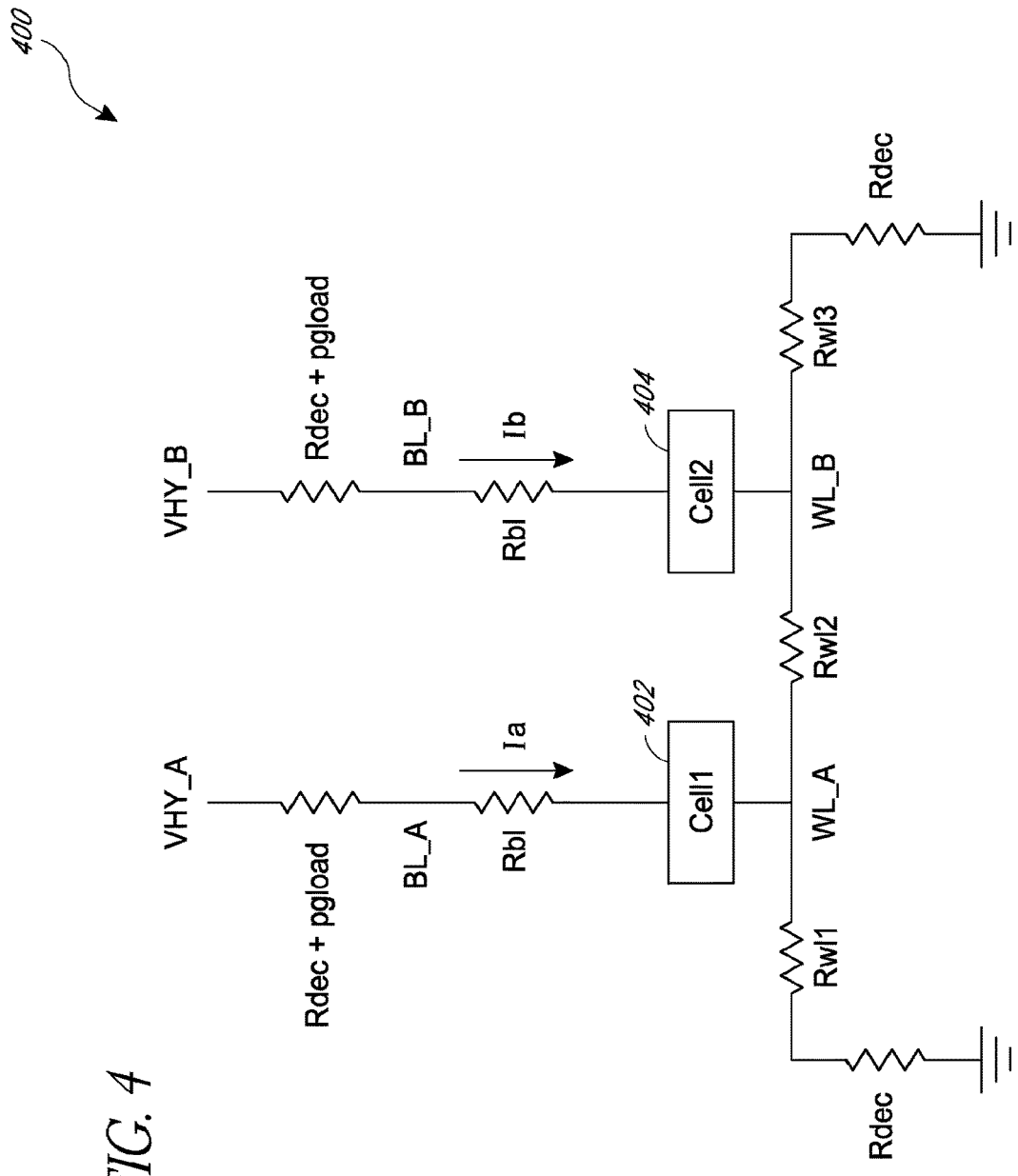
FIG. 4 illustrates a simplified model of accessing two cells in an array.

FIG. 4 illustrates a simplified model 400 of accessing two cells at a time in an array. It will be understood that more than two cells can be accessed at the same time. Nonetheless, FIG. 4 illustrates issues that can arise when accessing more than one cell at a time per word line. Each of a first cell 402 and a second cell 404 are on separate bit lines BL_A, BL_B, respectively. It should be noted that while there can be thousands of bit lines per word line, the first cell 402 and the second cell 404 share the same word line in this example.

The model 400 uses resistances to model many of the elements of an array. Circuits, such as column decoders, row decoders, and/or modulators will typically be implemented with MOS transistors. When these MOS transistors are "on," they are associated with an "on" resistance typically referred to as a drain-to-source resistance $R_{Dson}$. In the illustrated example, the word line crosses the length of the array and is decoded at both ends as indicated by the modeled resistances Rdec appearing at the left end and the right end. The word line can be relatively long. For simplicity, the resistance of the word line is modeled as three resistances: Rw11, Rw12, and Rw13. As previously noted, a word line can be relatively long and can be connected to thousands of cells. The resistance of the word line that is encountered by a particular cell depends on the cell's position along the word line. This can further increase the difficulty in accurately setting the voltage $V_{cell}$ (FIG. 1) across a cell for programming. In one embodiment, the programming voltages $V_{HY\_A}$, $V_{Hy\_B}$ are buffered to generate the programming voltages VA and $V_B$ having the same magnitudes as the programming voltages $V_{HY\_A}$, $V_{HY\_B}$.

Figure 5:
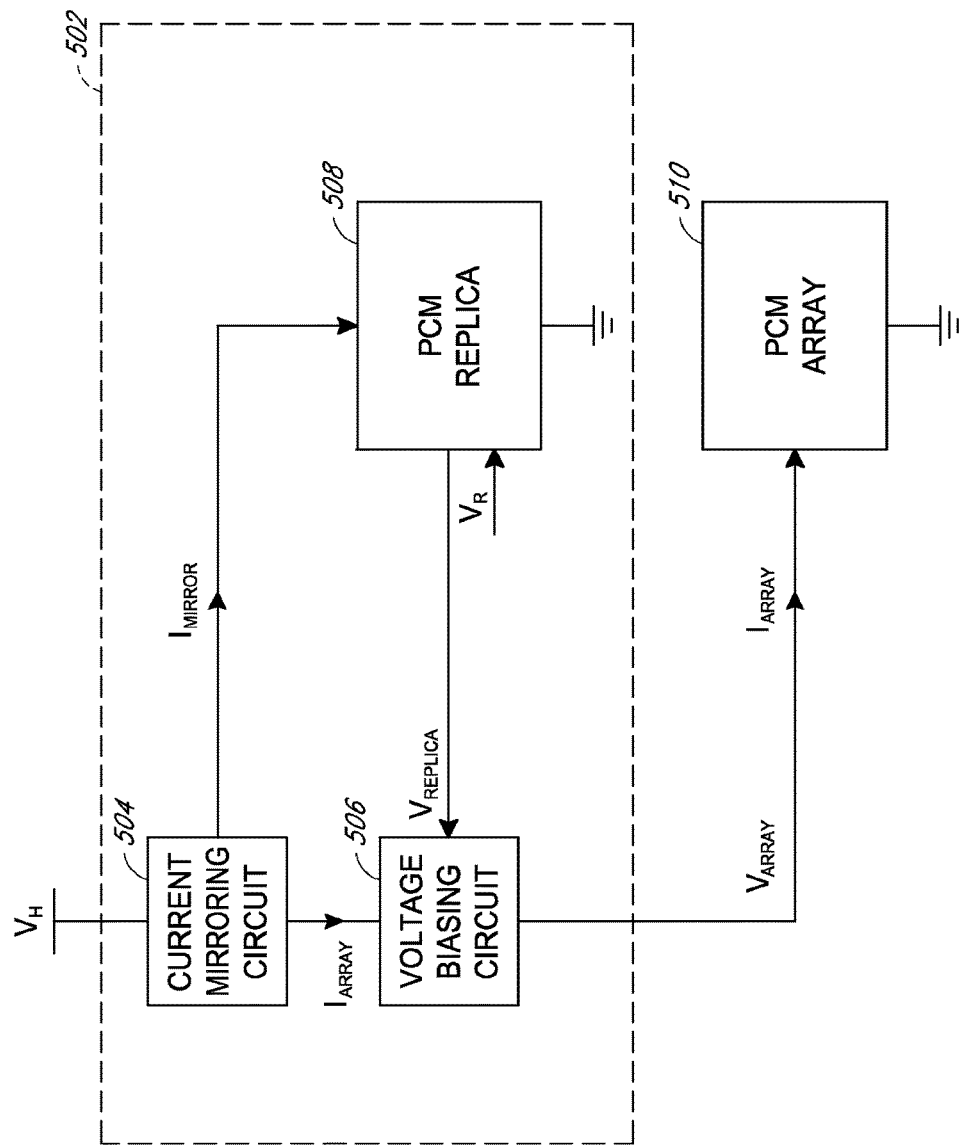
FIG. 5 illustrates a top-level view of an embodiment of the invention.
Figure 10:
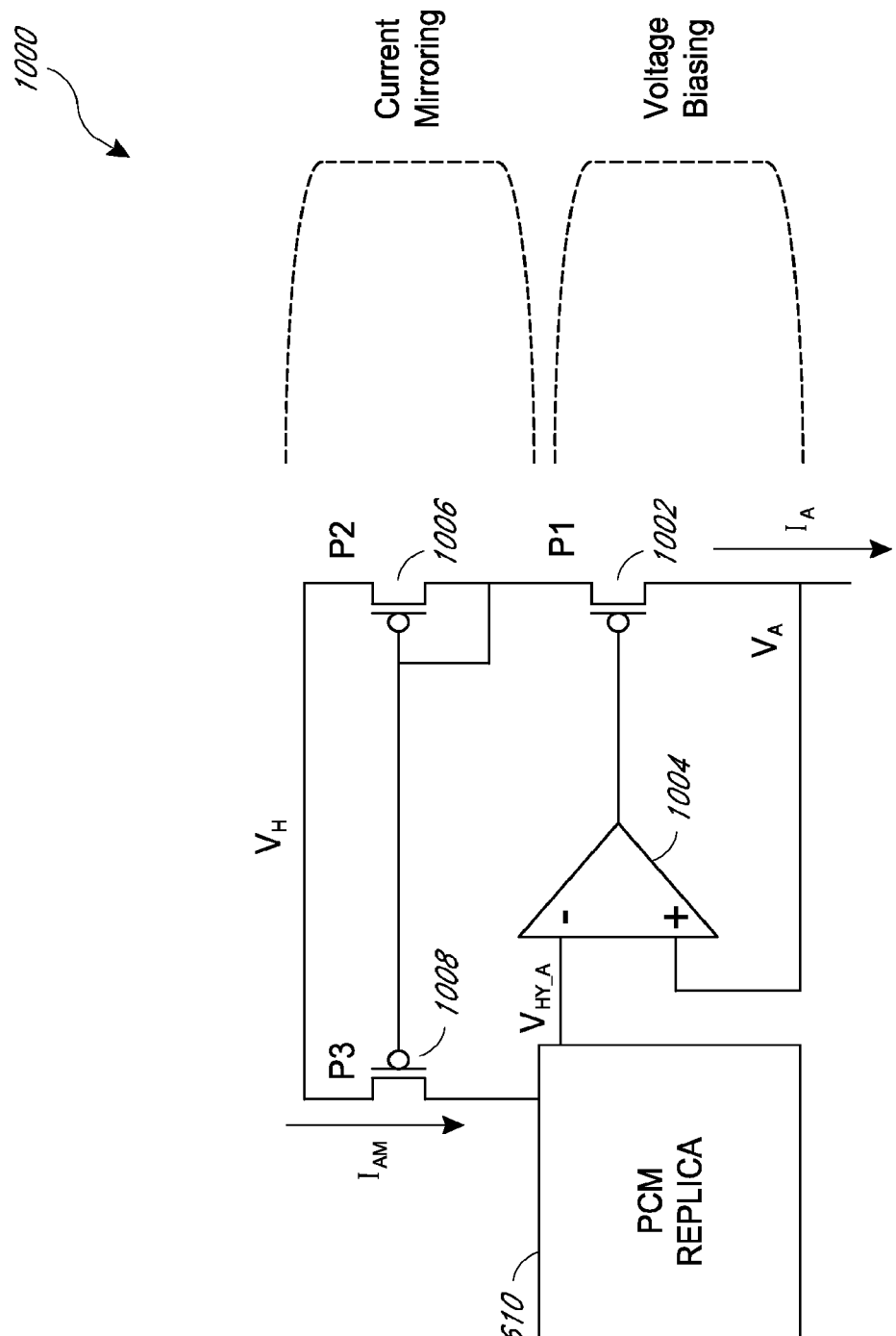
FIG. 10 illustrates one embodiment of a current mirroring and voltage biasing circuit.
Figure 11:
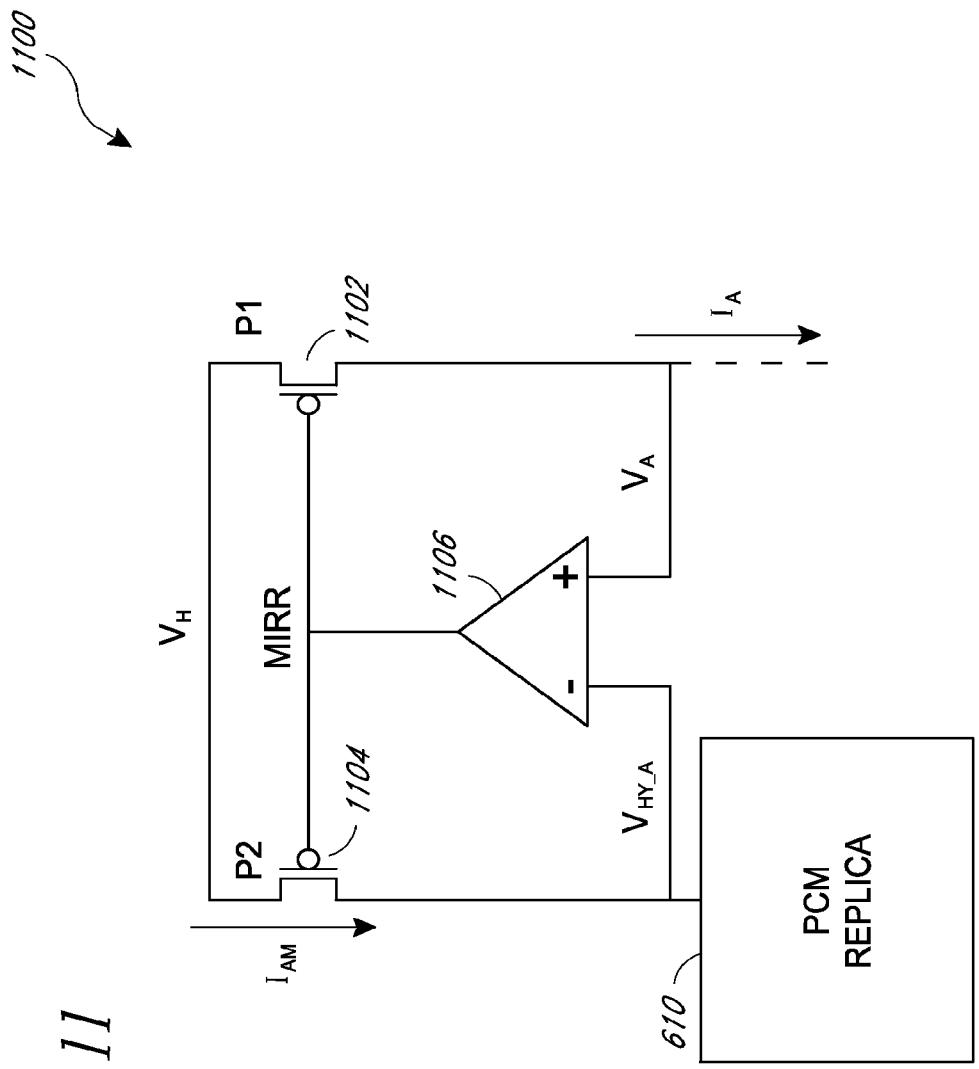
FIG. 11 illustrates an embodiment of a current mirroring and voltage biasing circuit that combines current mirroring and voltage biasing.

FIG. 5 illustrates a top-level view of a programming voltage generator 502 according to an embodiment of the invention. The illustrated programming voltage generator 502 includes a current mirroring circuit 504, a voltage biasing circuit 506, and a PCM replica circuit 508. Each of these elements can be integrated into an integrated circuit for a memory device. Embodiments of the current mirroring circuit 504 and the voltage biasing circuit 506 will be described in greater detail later in connection with FIGS. 10 and 11. It should be noted that the current mirroring circuit 504 and the voltage biasing circuit 506 can be combined as illustrated in FIG. 11. Further details of a two bit line version of the PCM replica circuit 508 will be described later in connection with FIG. 7.

The programming voltage generator 502 operates via a feedback loop. In a first part of the feedback loop, current $I_{ARRAY}$ passing through a PCM array 510 is mirrored as current $I_{MIRROR}$ and passed through the PCM replica circuit 508. The PCM replica circuit 508 uses the current $I_{MIRROR}$ and an input voltage $V_R$ to generate the replica programming voltage $V_{REPLICA}$. In a second part of the feedback loop, the replica programming voltage $V_{REPLICA}$ is buffered by the voltage biasing circuit 506 to generate a programming voltage $V_{ARRAY}$, which in turn helps to generate the current $I_{ARRAY}$. The voltage biasing circuit 506 also maintains the same current $I_{ARRAY}$ as an input and as an output such that the current mirroring circuit 504 can observe the same current flowing through the PCM array 510. Such feedback loops can be difficult to start, and starting the feedback loop will be described later in connection with FIG. 12. FIG. 5 will now be described in greater detail.

The programming voltage generator 502 generates a programming voltage $V_{ARRAY}$ for the PCM array 510 from the voltage $V_H$, which can be from a power supply voltage rail. Depending on the configuration, the programming voltage $V_{ARRAY}$ can be similar to the programming voltage $V_o$ (FIG. 1) (see Eq. 1) or can be slightly different by incorporating the function (including the voltage drop $V_{PGL}$) of the modulator (FIG. 1) (see Eq. 2), an example of which will be described later in connection with FIG. 14.

$$V_{ARRAY} = V_{PGL} + V_{Ydec} + V_{BL} + V_{cell} + V_{WL} + V_{Xdec} \quad \text{Eq. 1}$$

$$V_{ARRAY} = V_{Ydec} + V_{BL} + V_{cell} + V_{WL} + V_{Xdec} \quad \text{Eq. 2}$$

When the programming voltage $V_{ARRAY}$ is applied to a programming voltage node $V_{HY}$, a current $I_{ARRAY}$ flows through the node. The current mirroring circuit mirrors the current $I_{ARRAY}$ to generate a mirrored current $I_{MIRROR}$. The mirrored current $I_{MIRROR}$ is provided as an input to the PCM replica circuit 508. In the illustrated embodiments, the mirroring is performed without scaling. In alternative embodiments, the currents can be scaled when mirrored with appropriate scale changes to the resistances.

The PCM replica circuit 508 comprises circuits that represent (e.g., replicate or emulate, whether directly or via scaling) the voltage drops of the programming path described earlier in connection with FIG. 1 and includes a controlled drop across the PCM cell. The voltage drops can be generated by passing the mirrored current $I_{MIRROR}$ (which can be the same as $I_{ARRAY}$ or a scaled version of the same) through the same or scaled decoders, resistances for bit lines and word lines, and the like. The voltage drop $V_{cell}$ across the replica of the PCM cell can be set by a voltage source and controlled by an input voltage $V_R$ as will be described later in connection with FIG. 9. The resulting replica programming voltage $V_{REPLICA}$ s then at an appropriate voltage level to apply as the programming voltage $V_{ARRAY}$ to have the voltage VR applied across the PCM cell. This can be performed without expensive procedures at manufacturing test. While the PCM replica circuit 508 is drawn in FIG. 5 with separate inputs for the current $I_{MIRROR}$ and the input voltage $V_R$ and a separate output for the replica programming voltage $V_{REPLICA}$, it should be noted that the input for the current $I_{MIRROR}$ and the output for the replica programming voltage $V_{REPLICA}$ can be at the same node. It should be noted that the PCM replica circuit 508 can be shared among many different cells and indeed, even among different arrays. However, for programming in parallel, more than one PCM replica circuit 508 will typically be present.

It can be advantageous to program multiple cells in parallel. The tiling of arrays illustrated in FIG. 2 is one way to program in parallel. Another way of programming in parallel is within an array, such as by programming two different cells of the same word line at the same time. These two cells will have different bit lines.

Figure 6:
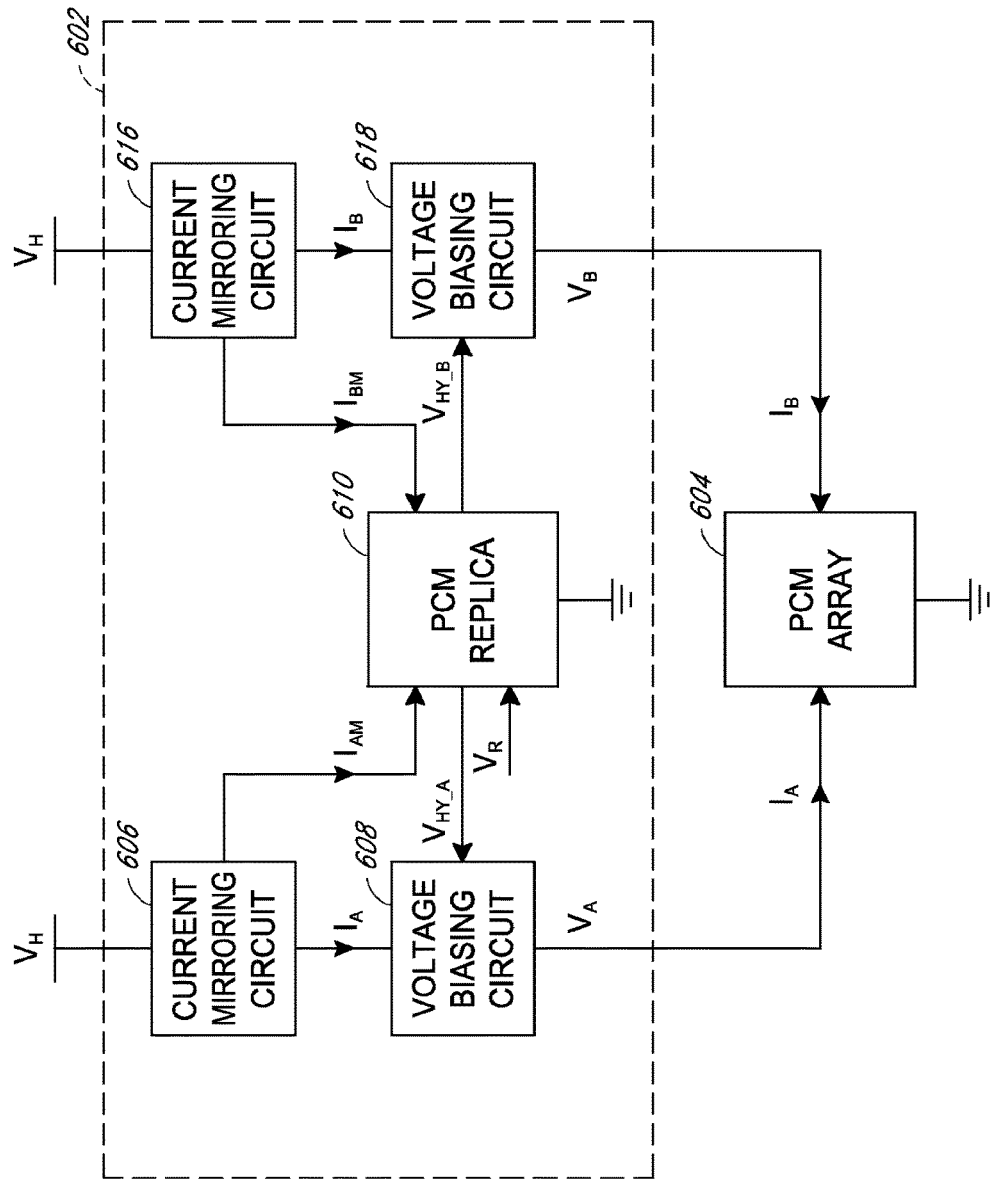
FIG. 6 illustrates a top-level view of a programming voltage generator capable of programming two cells of the same word line at a time.

FIG. 6 illustrates a top-level view of a programming voltage generator 602 capable of programming two cells of the same word line of a PCM array 604 at a time. Each of these elements can be integrated into an integrated circuit for a memory device. The basic operation is similar to that described earlier in connection with FIG. 5; however, two PCM cells can share the same word line and there can be more than one row decoder per word line. While illustrated in the context of programming two cells, the principles and advantages described herein are also applicable to the programming of more than two cells at the same time per word line. There can be variability in the voltage drops across the decoders and in addition, based on a cell's position along the word line, there can be variability in the amount of word line resistance that is applicable for a particular cell. Thus, two different programming voltages $V_{HY\_A}$, $V_{HY\_B}$ are generated, and two different currents $I_A$, $I_B$ are mirrored as explained further below.

The PCM array 604 can correspond to the model 400 described earlier in connection with FIG. 4. As modeled in FIG. 4, programming voltages $V_{HY\_A}$, $V_{HY\_B}$ give rise to currents $I_A$, $I_B$. These currents $I_A$, $I_B$ each flow through a particular column decoder, through the modulator, bit line resistance, and respective cell 402, 404. The currents $I_A$, $I_B$ then flow through a common word line and can flow through more than one row decoder. The currents $I_A$, $I_B$ are mirrored by current minoring circuits 606, 616 to generate mirrored currents $I_{AM}$, $I_{BM}$, which are provided as inputs to a PCM replica circuit 610. The current mirroring circuits 606, 616 can be the same as the current mirroring circuit 504 described earlier in connection with FIG. 5.

The mirrored currents $I_{AM}$, $I_{BM}$ generate voltage drops across resistances replicating resistances of the PCM array 604. In addition, an input voltage $V_R$ is provided as an input to the PCM replica circuit 610 and contributes to the replica programming voltages $V_{HY\_A}$, $V_{HY\_B}$ generated as an output of the PCM replica circuit 610. One embodiment of the PCM replica circuit 610 will be described in greater detail later in connection with FIG. 7. The voltage biasing circuits

608, 618 are in series with the mirror currents $I_{AM}$, $I_{BM}$ and buffer the replica programming voltages $V_{HY\_A}$, $V_{HY\_B}$ to generate the programming voltages $V_A$, $V_B$, which are provided as inputs to the PCM array 604. The voltage biasing circuits 608, 618 can be the same as the voltage biasing circuit 506 described earlier in connection with FIG. 5. In addition, it should be noted that a current mirroring circuit can be combined with a voltage biasing circuit as illustrated in FIG. 11, or can be separate circuits as illustrated in FIG. 10. Further, it should be noted that one node can be used as an input for the current $I_{AM}$ and an output for the replica programming voltage $V_{HY\_A}$, and another node can be used as an input for the current IBM and an output for the replica programming voltage $V_{HY\_B}$. For programming in parallel, more than one PCM replica circuit 610 will typically be present in a memory device. However, the PCM replica circuit 610 can be shared among many different bit lines, word lines, and even different arrays.

Figure 7:
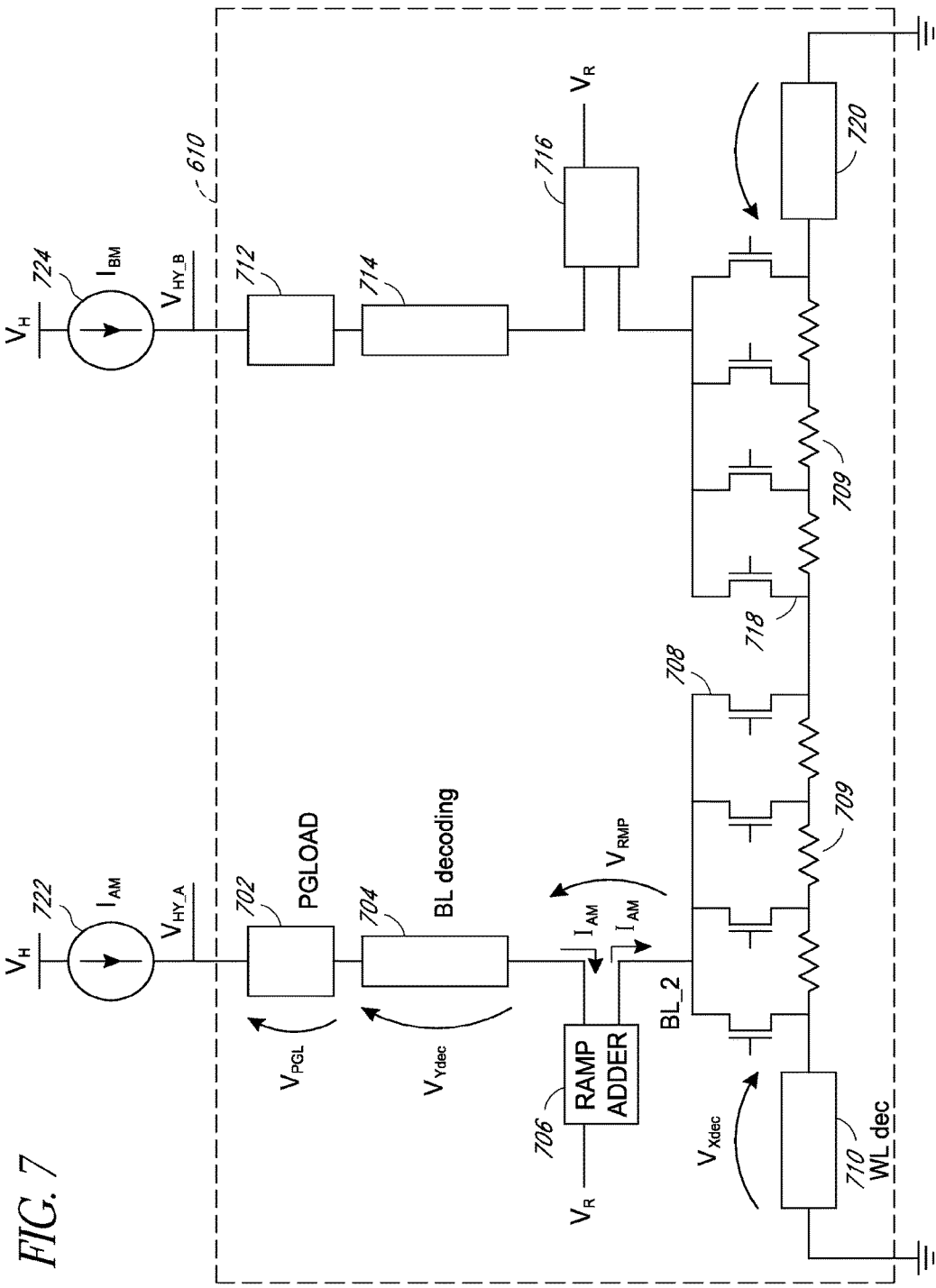
FIG. 7 illustrates one embodiment of a PCM replica circuit.

FIG. 7 illustrates further details of one embodiment for the PCM replica circuit 610. Two different programming voltages VHy A, VHy H for two different cells A, B of the same word line are generated. The PCM replica circuit 610 includes replica circuits 702, 712 for the modulator, replica circuits 704, 714 for column decoders, ramp adder circuits 706, 716, switches 708, 718, replica resistances 709 for the word line, and replica circuits 710, 720 for the row decoders. In one embodiment, these replica circuits or resistances are the same as that expected for the corresponding components of the PCM array 604. However, the replica resistances and the currents $I_{AM}$, $I_{BM}$ can alternatively be scaled. The replica circuits can be implemented by resistors or by active devices, such as devices similar to those used in the output stages of a column decoder or row decoder. For example, when no scaling is used, the replica circuits 704, 714, 710, 720 of the column decoder and the row decoder can be the same as the output circuits of the column decoders and the row decoders of the array. In one embodiment, the replica circuits 702, 712 replicate only the on-resistance drop of the modulator when the modulator is behaving as a short circuit, which will be explained later in connection with FIGS. 14-16. While drawn as part of the PCM replica circuit 610, the replica circuits 702, 712 of the modulator can also be considered to be outside of the PCM replica circuit 610.

In the illustrated embodiment, 6 resistances 709 replicate the resistance of a word line of the PCM array 604. There can be many, such as, but not limited to, thousands of cells per word line. Accordingly, the resistance of the word line can vary depending on a cell's position. A transistor from among the transistors 708, 718 is activated to select an appropriate node in the replica resistance 709 to represent the actual resistance encountered by a cell based on the cell's position along its word line. For example, when programming a cell close to a row decoder corresponding to the row decoder replica resistance 710, a transistor from among the transistors 708 switched on that is close to the replica resistance 710 can be switched on. By contrast, when programming a cell close to the middle of the word line, a transistor from among the transistors 708 that is close to the middle of the resistances can be activated. For cells in between an end and the middle, a transistor intermediate between the two can be switched on instead. While illustrated with 6 resistances, the number of resistances can vary in a very broad range. For example, 2, 4, 8, 10 or other numbers of resistances can be used. The resistance of the transistors 708 can be made negligible by sizing the transistors 708 relatively large or can be taken into account with the other replica resistances. Since there are relatively few replica circuits needed as compared to cells, the size of the components of a replica circuit is not as critical as it is in an array, and the transistors 708 can be made relatively large without much of a cost penalty.

To generate the programming voltages VHy A, VHY B, currents $I_{AM}$, $I_{BM}$ are applied from current sources 722, 724 to the node generating the programming voltages VHy A, VHy B, and an input voltage $V_R$ is applied to the ramp adder circuits 706, 716. In one embodiment, the current sources 722, 724 are provided by the current mirroring circuits 606, 616 (FIG. 6), example embodiments of which will be described in greater detail later in connection with FIGS. 10 and 11. The currents $I_{AM}$, $I_{BM}$ generate voltage drops across the applicable replica resistances. For example, the current $I_{AM}$ generates a voltage drop across the replica resistances 702, 704, 710 and some part of the word line replica resistance 709. It should be noted that since both the current $I_{AM}$ and the current $I_{BM}$ flow through the same word line replica resistance 709, there is interaction between the two programming voltages VHy A, VHy B similar to the interaction found on the PCM array 604.

Figure 8:
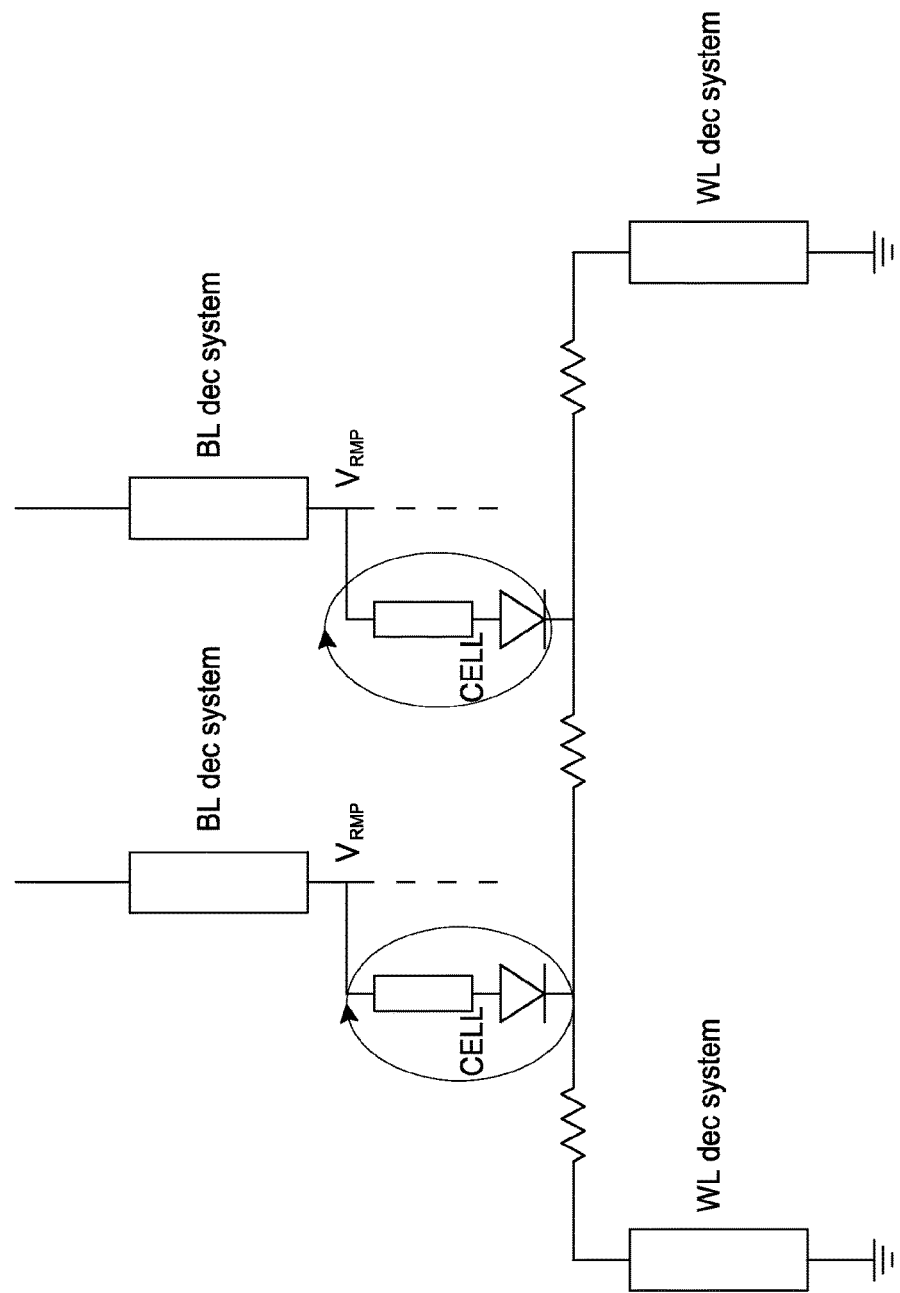
FIG. 8 illustrates a voltage drop $V_{RMP}$ across a cell.

In the illustrated embodiment, the ramp adder circuits 706, 716 generate an adjustable voltage drop $V_{RMP}$ equal in magnitude to the input voltage $V_R$. However, there can be gain or loss, for example, scaling, in alternative embodiments such that the magnitude of the adjustable voltage drop $V_{RMP}$ and the input voltage $V_R$ do not necessarily have to be equal. The adjustable voltage drop $V_{RMP}$ is an adjustable voltage drop for representing the voltage drop of the cell (e.g., across a programmable element and a selector), and should be equal to the desired level for the voltage $V_{cell}$ to be dropped across a cell as shown in FIG. 8 and earlier in FIG. 1. In one embodiment, the input voltage $V_R$ is referenced to a voltage reference, such as ground, while the adjustable voltage drop $V_{RMP}$ is a voltage drop that is floating due to the voltage drops across the replica resistances for the word line and the row decoder. Of course, the adjustable voltage drop $V_{RMP}$ can vary based on the cell geometry, cell material, and the type of selector used. In the illustrated embodiment, the adjustable voltage drop $V_{RMP}$ is about 3.8 volts, however, other voltages can be used. For example, in other embodiments, the adjustable voltage drop $V_{RMP}$ can be in the range of 3.7V to 3.9V, or 3.6V to 4.0V, or 3.5V to 4.2V. Other applicable voltages will be readily determined by one of ordinary skill in the art.

Figure 9:
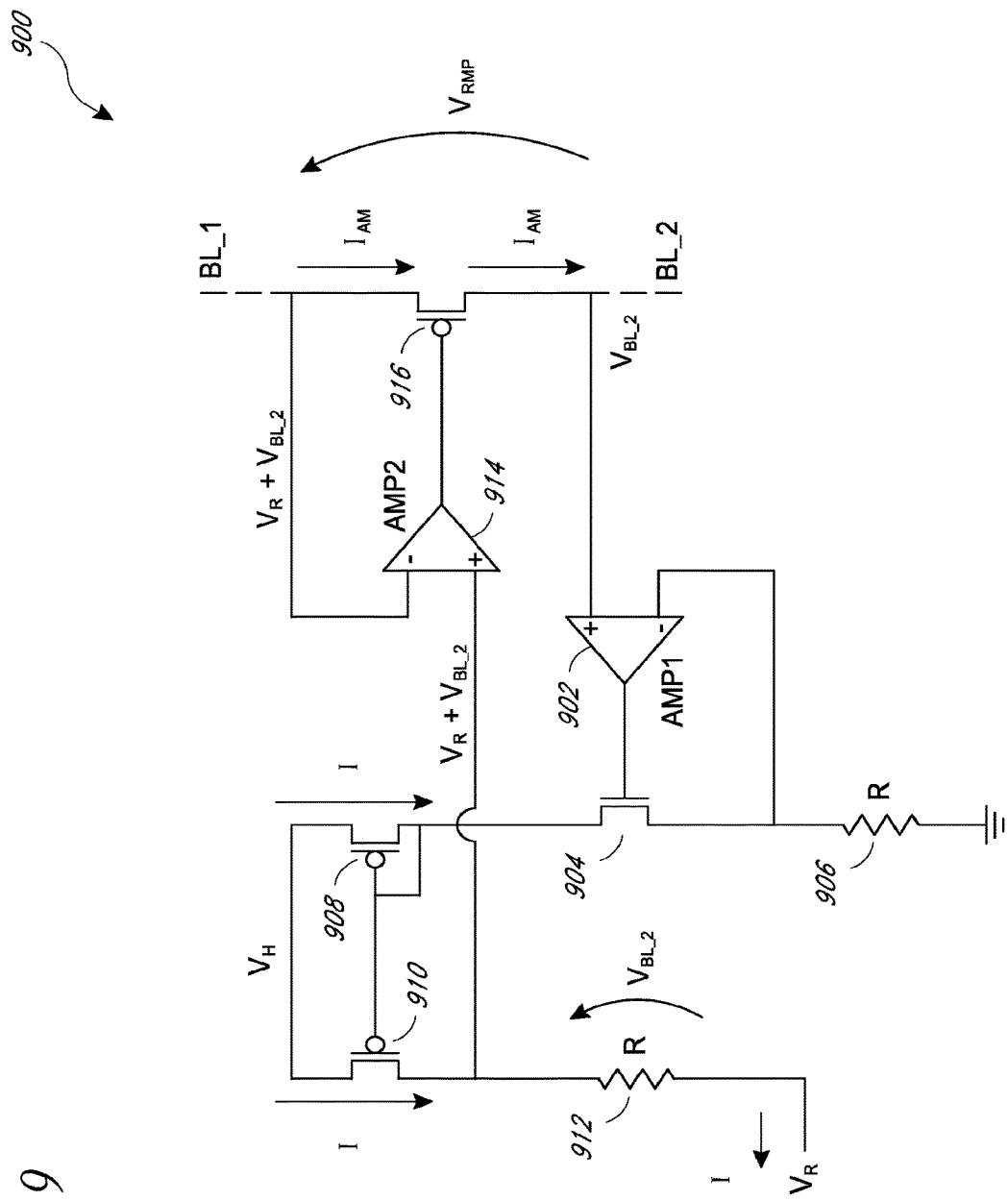
FIG. 9 illustrates one embodiment of a ramp adder circuit.

FIG. 9 illustrates one embodiment of a ramp adder circuit 900. The ramp adder circuit 900 can be used for the ramp adder circuit 706 or the ramp adder circuit 716 of FIG. 7. The ramp adder circuit 900 generates an adjustable voltage drop $V_{RMP}$ that is floating with respect to a first node BL_1 and a second node BL 2, and maintains the current $I_{AM}$ passing through the ramp adder circuit 900. The adjustable voltage drop $V_{RMP}$ can be about equal to an input voltage $V_R$ that is referenced to a voltage reference, such as ground or VSS. In alternative embodiments, there can be scaling, such as gain or loss, between the magnitudes of the adjustable voltage drop $V_{RMP}$ and the input voltage $V_R$.

The ramp adder circuit 900 includes a first amplifier 902, a first N-type MOS (NMOS) transistor 904, a first resistor 906, a first P-type MOS (PMOS) transistor 908, a second PMOS transistor 910, a second resistor 912, a second amplifier 914, and a third PMOS transistor 916. The operation of the ramp adder circuit 900 will now be described. In the following description, it is assumed that input currents of the amplifiers and gate currents of the transistors are negligible.

The voltage $V_{BL\_2}$ from the node BL_2 is provided as an input to a non-inverting input of the first amplifier 902, which can be an operational amplifier. The output of the first amplifier 902 drives a gate of the first NMOS transistor 904. A source of the first NMOS transistor 904 is coupled to an inverting input of the first amplifier 902 and to a first end of the first resistor 906. Due to feedback, the node of the source of the first NMOS transistor 904 will be at a voltage that is about the same as the voltage $V_{BL\_2}$. Ignoring current through the non-inverting input of the first amplifier 902 as being negligible, a current I passes through the first resistor 906 having a value of the voltage $V_{BL\_2}$ divided by the resistance R. The same current I passes through the first NMOS transistor 904 and through the first PMOS transistor 908.

The first PMOS transistor 908 is connected in a diode configuration with its gate tied to its drain. The sources of the first PMOS transistor 908 and the second PMOS transistor 910 are tied to a power supply voltage bias VH. The gates of the first PMOS transistor 908 and the second PMOS transistor 910 are tied to each other. Thus, the first PMOS transistor 908 and the second PMOS transistor 910 have the same gate-to-source voltages such that the first PMOS transistor 908 and the second PMOS transistor 910 form a current mirror. In the illustrated embodiment, the first PMOS transistor 908 and the second PMOS transistor 910 are also matched in geometry. Accordingly, the same amount of current I flows through the second PMOS transistor 910 and the first PMOS transistor 908.

A first end of the second resistor 912 is coupled to the drain of the second PMOS transistor 910, and a second end of the second resistor is coupled to a node providing the input voltage $V_R$. The current I flows through the second resistor 912, which has the same resistance R and the same current I as the first resistor 906. Thus, the voltage drop of I times R across the second resistor 912 is the same as the voltage drop across the first resistor 906, that is, about voltage $V_{BL\_2}$. The drop of $V_{BL\_2}$ when added to the input voltage $V_R$ existing at the second end of the second resistor 912 yields a voltage of $V_R+V_{BL\_2}$ at the node of the first end of the second resistor 912, drain of the second PMOS transistor 910, and non-inverting input of the second amplifier 914.

The second amplifier 914 can be an operational amplifier. An output of the second amplifier 914 is coupled to a gate of the third PMOS transistor 916. A source of the second amplifier 914 is coupled to the node BL_1, and a drain of the second amplifier 914 is coupled to the node BL_2. The inverting input of the second amplifier 914 is also coupled to the node BL_1. Due to feedback, the second amplifier 914 provides a gate voltage to the second amplifier 914 such that the voltage at the node BL_1 is about equal to $V_R+V_{BL\_2}$. Recall that the node BL_2 has the voltage $V_{BL\_2}$. Thus, it can be observed that the voltage drop from source to drain of the third PMOS transistor 916 is a floating adjustable voltage $V_{RMP}$ having the same magnitude as the input voltage $V_R$.

Since the cell voltage $V_{cell}$ can now be relatively precisely controlled, in one embodiment, the input voltage $V_R$ can further take temperature into account. For example, a typical PCM device will have a temperature sensor embedded therein. The voltage $V_{cell}$ applied to a cell to melt the cell should vary with temperature for better performance. The input voltage $V_R$ can be compensated over temperature. For example, a lookup table can be used to store appropriate settings for the input voltage $V_R$, which can then have its level set by a controller of a digital-to-analog converter. The controller can be implemented by a microprocessor executing program instructions, a microcontroller executing program instructions, a logic circuit, a combination of the foregoing, or the like.

Alternatives and variations of the circuit of FIG. 9 exist. For example, in the illustrated embodiment, the same amount of resistance is used for the first resistor 906 and the second resistor 912 and mirroring without scaling is used for the currents through the first PMOS transistor 908 and the second PMOS transistor 910. In an alternative embodiment, the resistances and currents can be scaled. For example, in an alternative embodiment, the first resistor 906 can have half the resistance of the second resistor 912, and the current passing through the second PMOS transistor 910 can then have half the current passing through the first PMOS transistor 908 to yield the same voltage drops. For example, if the second PMOS transistor 910 has half the effective width of an otherwise identical first PMOS transistor 908, then the current mirror will be scaled by half. In another example, a complementary version of at least a portion of the circuit can be applicable. For example, the third PMOS transistor 916 can be replaced by an NMOS transistor and the non-inverting and inverting inputs of the amplifier 914 swapped.

FIG. 10 illustrates one embodiment of a current mirroring and voltage biasing circuit 1000. A first PMOS transistor 1002 and an amplifier 1004 form a voltage biasing circuit that can be used for the voltage biasing circuits 506, 608, 618. The labeling in FIG. 10 corresponds to the voltage biasing circuit 608 of FIG. 6. A second PMOS transistor 1006 and a third PMOS transistor 1008 form a current mirroring circuit that can be used for the current mirroring circuit 504, 606, 616. The operation of the current mirroring and voltage biasing circuit 1000 will now be described. In the following description, it is assumed that input currents of the amplifiers and gate currents of the transistors are negligible.

Sources of the second PMOS transistor 1006 and the third PMOS transistor 1008 are coupled to the power supply bias voltage $V_H$. A gate and a drain of the second PMOS transistor 1006 are coupled together in a diode configuration. A gate of the third PMOS transistor 1008 is coupled to the gate of the second PMOS transistor 1006 such that the second PMOS transistor 1006 and the third PMOS transistor 1008 have the same gate-to-source voltage. With the second PMOS transistor 1006 and the third PMOS transistor 1008 matched and having the same gate-to-source voltage, the same amount of current IA flows through each transistor 1006, 1008, with the current flowing through the second PMOS transistor 1006 controlling the amount of current IA.

The drain of the second PMOS transistor 1006 is also coupled to the source of the first PMOS transistor 1002. The drain of the first PMOS transistor 1002 is coupled to a non-inverting input of the amplifier 1004. The amplifier 1004 can be an operational amplifier. Due to the phase inversion from the gate to the drain of the first PMOS transistor 1002, the feedback loop uses the non-inverting input of the amplifier 1004 as the input for negative feedback. The output of the amplifier 1004 is coupled to the gate of the first PMOS transistor 1002. A voltage $V_{HY\_A}$ from the PCM replica circuit 610 is provided as an input to the inverting input of the amplifier 1004. It should be noted that the same node can be used to receive the current $I_{AM}$ and to provide the voltage $V_{HY\_A}$. The operation of the feedback loop provides that the amplifier 1004 adjusts the gate voltage of the first PMOS transistor 1002 such that the programming voltage $V_A$ on the drain of the first PMOS transistor 1002 is about the same as the voltage $V_{HY\_A}$. The programming voltage $V_A$ is provided as an input to the PCM array 604.

FIG. 11 illustrates an embodiment of a current mirroring and voltage biasing circuit 1100 that combines current mirroring and voltage biasing. One advantage that the current mirroring and voltage biasing circuit 1100 has over the current mirroring and voltage biasing circuit 1000 is that the current mirroring and voltage biasing circuit 1100 can operate with a smaller voltage drop since there is only one transistor in the current path versus two transistors. The labeling in FIG. 11 corresponds to the voltage biasing circuit 608 of FIG. 6.

The current mirroring and voltage biasing circuit 1100 includes a first PMOS transistor 1102, a second PMOS transistor 1104, and an amplifier 1106. The sources of the first PMOS transistor 1102 and the second PMOS transistor 1104 are coupled to a power supply bias voltage VH. The gates of the first PMOS transistor 1102 and the second PMOS transistor 1104 are coupled to a node MIRR, which is driven by the output of the amplifier 1106. With the first PMOS transistor 1102 and the second PMOS transistor 1104 matched and sharing the same gate-to-source voltage, the current IA passing through the first PMOS transistor 1102 and the current $I_{AM}$ passing through the second PMOS transistor 1104 should be about the same. The PCM replica circuit 610 generates the voltage $V_{HY\_A}$, which is provided as an input to an inverting input of the amplifier 1106.

The phase inversion going from gate to drain for the first PMOS transistor 1102 and the second PMOS transistor 1104 results in the non-inverting input being the input for negative feedback. The operation of the feedback loop provides that the programming voltage VA that is present at the drain of the first PMOS transistor 1102 and at the non-inverting input of the amplifier 1106 is about equal to the voltage $V_{HY\_A}$. The programming voltage VA is provided as an input to the PCM array 604.

Figure 12:
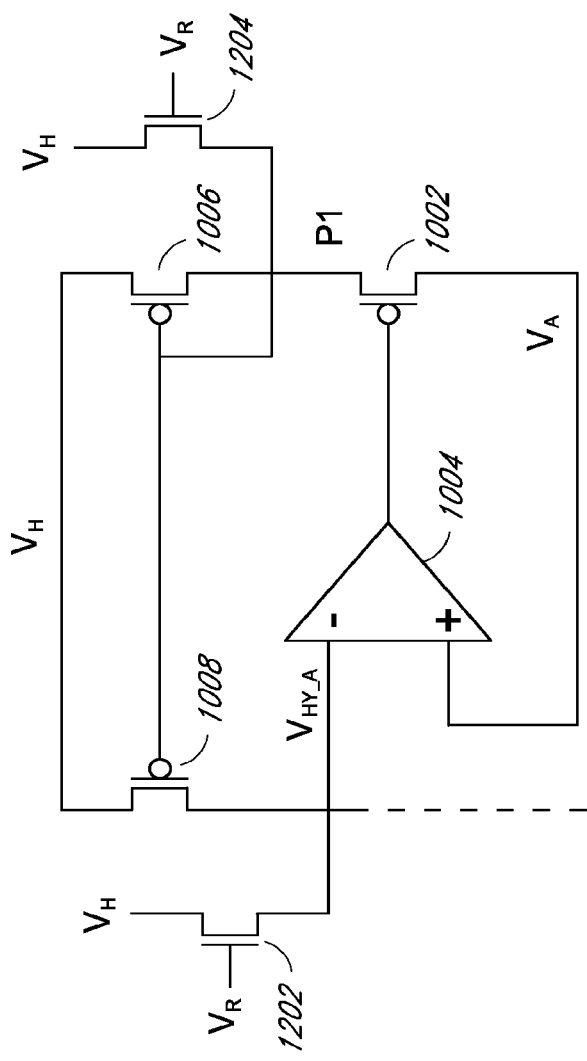
FIG. 12 illustrates an example of a circuit that can be used to assist in starting of a feedback loop.

FIG. 12 illustrates an example of a circuit that can be used to assist in starting of a feedback loop. The circuit is illustrated in the context of the current mirroring and voltage biasing circuit 1000 (FIG. 10) and includes a first NMOS transistor 1202 and, in at least in some embodiments, a second NMOS transistor 1204. The gate of the first NMOS transistor 1202 is tied to the input voltage $V_R$, the drain to the voltage VH, and the source to the node with the voltage $V_{HY\_A}$. The first NMOS transistor 1202 operates as a source follower and thus biases the node with the voltage $V_{HY\_A}$ to a voltage of the input voltage $V_R$ minus a gate-to-source voltage drop. This ensures that the programming voltage VA starts at a nonzero voltage and provides some current to the PCM replica circuit 508 or the PCM replica circuit 610. When the voltage $V_{Hy\_A}$ rises on its own, the first NMOS transistor 1202 becomes cutoff. Similarly, the second NMOS transistor 1204 can also be in a source follower configuration and can provide an initial amount of current and voltage biasing. Adding the second NMOS transistor 1204 can help provide symmetry and assists to further increase the speed at which the feedback loop can be started. The same node with the voltage $V_{HY\_A}$ of the current mirroring and voltage biasing circuit 1100 can be biased in a like manner by the first NMOS transistor 1202 for starting of the programming voltage generator 602 with the current mirroring and voltage biasing circuit 1100.

Figure 13:
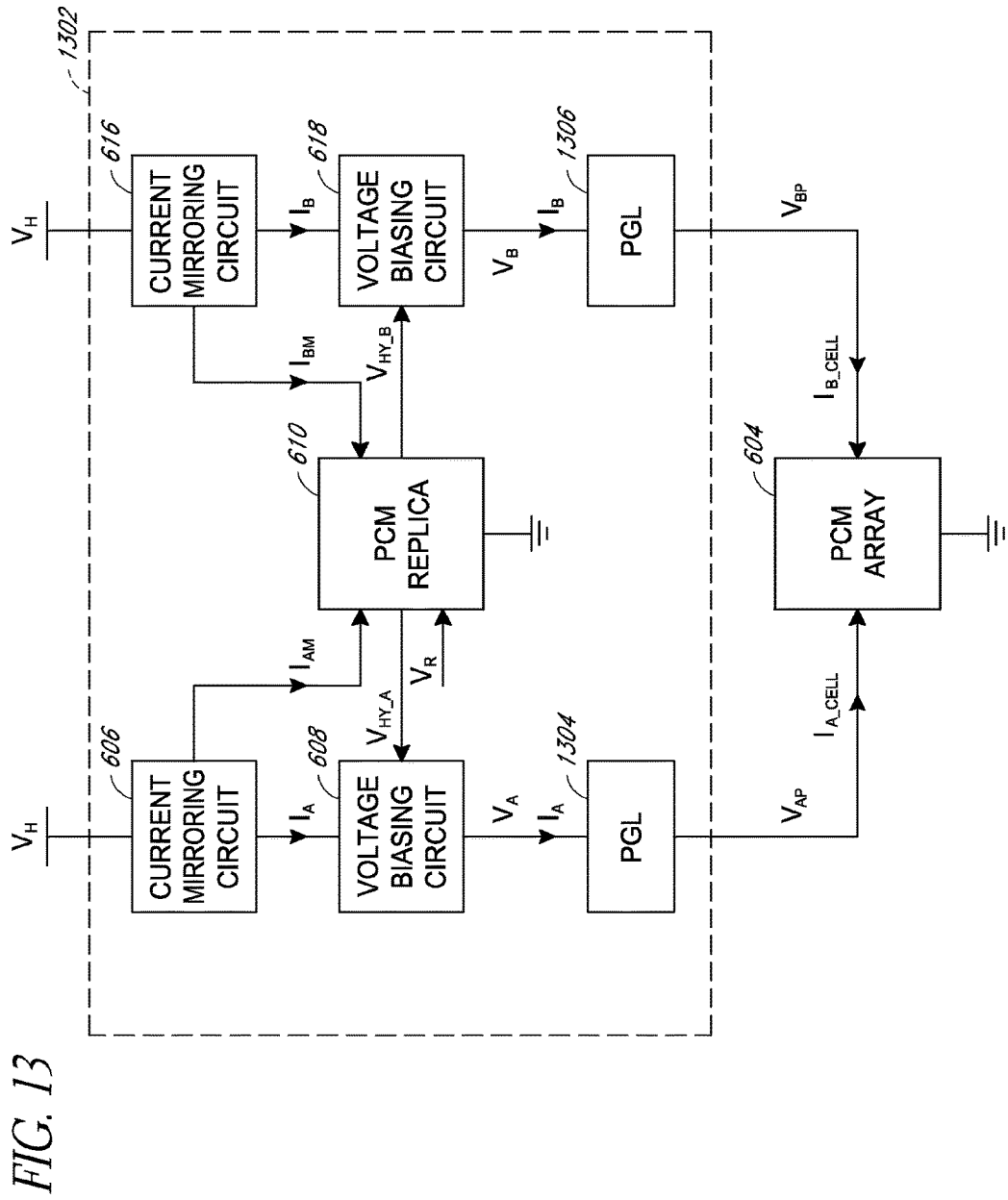
FIG. 13 illustrates a top-level view of a programming voltage generator with fast ramping capability.

FIG. 13 illustrates a top-level view of a programming voltage generator 1302 with fast ramping capability. The programming voltage generator 1302 is similar to the programming voltage generator 602 of FIG. 6, but with the addition of a first modulator block 1304 and a second modulator block 1306. To avoid repetition of description, components having the same or similar function are referenced by the same reference number. The principles and advantages are also applicable to the PCM replica circuit of FIG. 5.

The first modulator block 1304 and the second modulator block 1306 receive the programming voltages $V_A$, $V_B$ as inputs and generate programming voltages $V_{AP}$, $V_{BP}$ as outputs. To ramp the programming voltages $V_{AP}$, $V_{BP}$ relatively slowly to generate, for example, a crystalline structure, the first modulator block 1304 and the second modulator block 1306 can be short circuits such that the programming voltages $V_{AP}$, $V_{BP}$ are the same as the programming voltages $V_A$, $V_B$, and the ramping is provided by manipulation of the adjustable voltage drop $V_{RMP}$ within the PCM replica circuit 610, which in turn adjusts the levels of the programming voltages $V_A$, $V_B$.

However, to ramp the programming voltages $V_{AP}$, $V_{BP}$ relatively quickly to generate, for example, an amorphous structure, the first modulator block 1304 and the second modulator block 1306 modify the programming voltages $V_A$, $V_B$ to generate a ramped profile for the programming voltages $V_{AP}$, $V_{BP}$. Fast ramping can make it possible to set the state of relatively many cells of an array, such as a block of cells, relatively quickly. The first modulator block 1304 and the second modulator block 1306 can be implemented by the circuit illustrated in FIG. 14.

Figure 14:
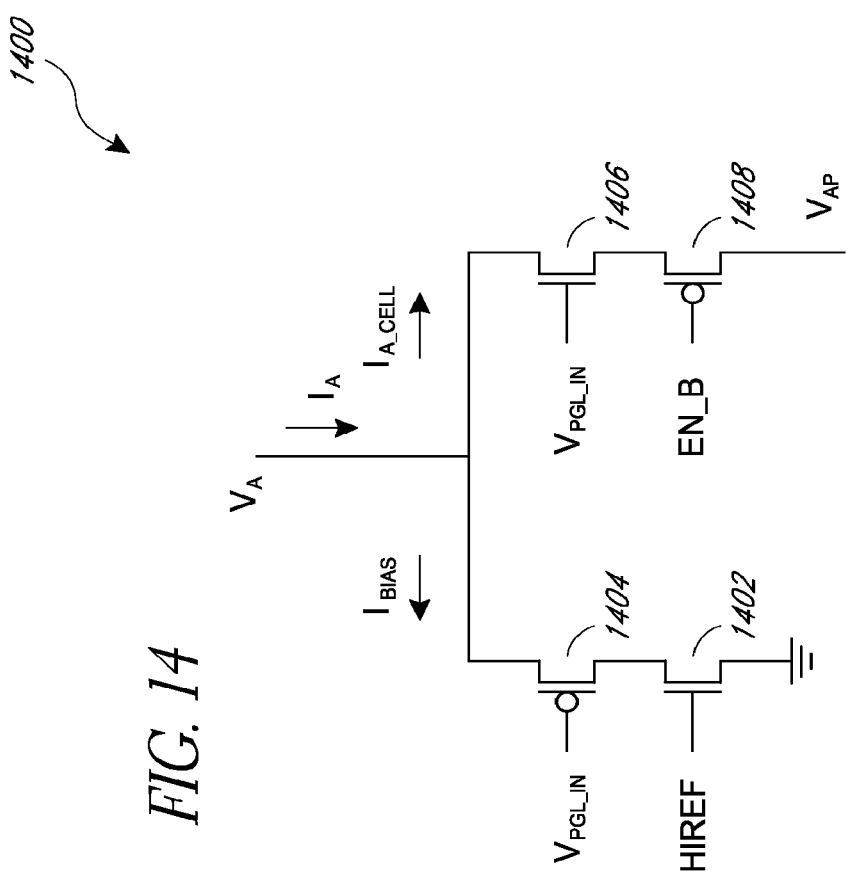
FIG. 14 illustrates a modulator according to an embodiment of the invention.

FIG. 14 illustrates a modulator 1400 according to an embodiment of the invention. The modulator 1400 is shown with the labeling for the first modulator block 1304, but the same circuit can be also be used for the second modulator block 1306. The illustrated modulator 1400 includes a first NMOS transistor 1402, a first PMOS transistor 1404, a second NMOS transistor 1406, and a second PMOS transistor 1408. A gate of the first NMOS transistor 1402 is tied to a signal HIREF, a source of the first NMOS transistor 1402 is tied to a low-voltage power supply reference VSS, such as a ground, and a drain of the first NMOS transistor 1402 is coupled to a drain of the first PMOS transistor 1404. A gate of the first PMOS transistor 1404 is tied to a signal $V_{PGL\_IN}$, and a drain of the first PMOS transistor 1404 is tied to the programming voltage $V_A$. A gate of the second NMOS transistor 1406 is tied to the signal $V_{PGL\_IN}$, a drain of the second NMOS transistor 1406 is tied to the programming voltage $V_A$, and a source of the second NMOS transistor 1406 is coupled to a source of the second PMOS transistor 1408. A gate of the second PMOS transistor 1408 is tied to a signal EN_B or EN (active low), and a drain of the second PMOS transistor 1408 provides the programming voltage $V_{AP}$. Since the second PMOS transistor 1408 is used for enabling/disabling, it can be substituted with an NMOS transistor with the enable signal changing to active high.

The modulator 1400 has two modes of operation: a first mode in which it provide a short circuit, and a second mode in which it is configured to generate a voltage drop in a ramped manner (e.g., a fast ramping function) in response to a ramped signal ($V_{PGL\_IN}$). The modulator 1400 can also be disabled by raising the signal EN_B high; otherwise, for the modes of operation, the signal EN_B should be low or at ground to turn on the second PMOS transistor 1408.

In the first mode of operation, the signal $V_{PGL\_IN}$ can be switched to the power supply bias voltage VH or high and the signal HIREF can also be set to the power supply bias voltage VH. In one embodiment, the signal HIREF can be permanently set to the power supply bias voltage VH. With the signal $V_{PGL\_IN}$ high, the first PMOS transistor 1404 is off, and the second NMOS transistor 1406 is on. Since both the second NMOS transistor 1406 and the second PMOS transistor 1408 are on, the programming voltage $V_{AP}$ is effectively shorted to the programming voltage $V_A$. With the first PMOS transistor 1404 off, the current IBIAS should be zero, and the current IA CELL should be about equal to the current IA.

Figure 15:
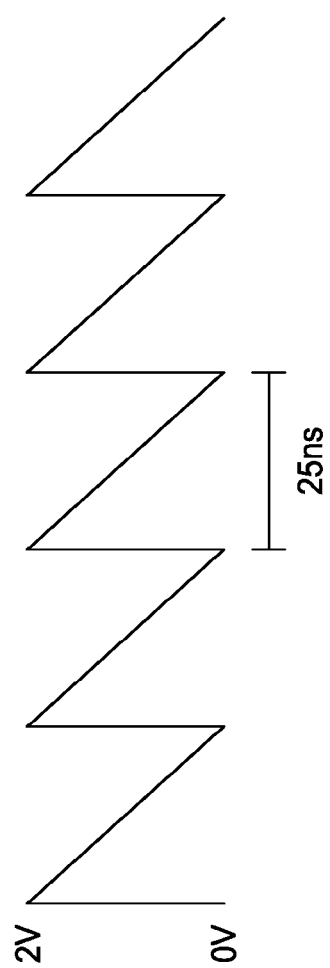
FIG. 15 illustrates an example of a ramping waveform.

In the second mode of operation, the first NMOS transistor 1402 can again be turned on by setting the signal HIREF to a high level, and the second PMOS transistor 1408 will likewise be turned on by setting the EN_B signal low. The signal $V_{PGL\_IN}$ is set to a ramping waveform such as illustrated in FIG. 15. In one embodiment, the signal $V_{PGL\_IN}$ corresponds to a sawtooth waveform as shown in FIG. 15 that starts at 0 volts, then jumps to 2 volts, and then ramps back down to 0 volts in about 25 nanoseconds before repeating. Other waveforms can be used. For example, a square wave can be used provided that the slope of the ramp down (falling edge) has the appropriate characteristic. In one non-limiting example, a slope smaller than 1 volt (V) per 20 nanoseconds (ns) can result in a crystalline state (typically logic 1) and a slope larger than 1V per 20 ns can result in an amorphous state.

With the signal $V_{PGL\_IN}$ applied to the gate of the second NMOS transistor 1406 and with the second PMOS transistor 1408 switched on such that there is negligible voltage loss across the second PMOS transistor 1408, the programming voltage $V_{AP}$ can be based on the output voltage of a source follower configuration (in the saturation region of operation) having an input signal of the signal $V_{PGL\_IN}$ as expressed in Equation 3 or, when the signal $V_{PGL\_IN}$ is sufficiently high, the second NMOS transistor 1406 can be switched on (in the linear or ohmic region of operation) such that the programming voltage $V_{AP}$ is about equal to the programming voltage $V_A$.

$$V_{AP} = V_{PGLIN} - V_{TH} \qquad \text{Eq. 3}$$

Figure 16:
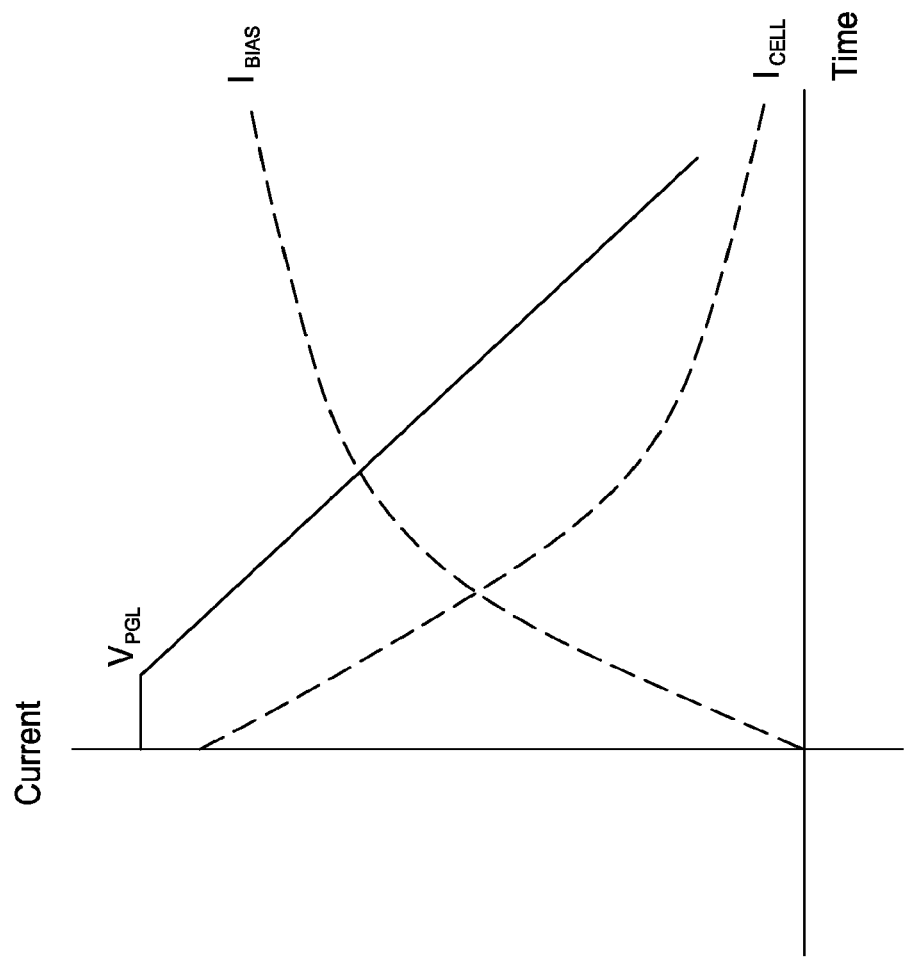
FIG. 16 illustrates an example of current versus time due to an input signal having a ramping waveform.

In Equation 3, the threshold voltage $V_{TH}$ is the threshold voltage of the second NMOS transistor 1406. The resulting effect on the current IA CELL provided to a PCM cell of the PCM array 604 is illustrated in FIG. 16. Time is expressed along a horizontal axis. Voltage and currents are expressed along a vertical axis. Further, the first PMOS transistor 1404 begins to turn on as the voltage of the signal $V_{PGL\_IN}$ goes low such that the current IBIAS begins to flow. Thus, the current IA is split between the current IA CELL and the current IBIAS. In the illustrated example, the current IBIAS is merely diverted to ground. However, by having the current IBIAS flow, this keeps the current IA flowing even when the current IA CELL goes to zero. The current IA is mirrored for biasing of the PCM replica circuit 610, so that by keeping the current IA flowing, the PCM replica circuit 610 can remain biased.

Figure 17:
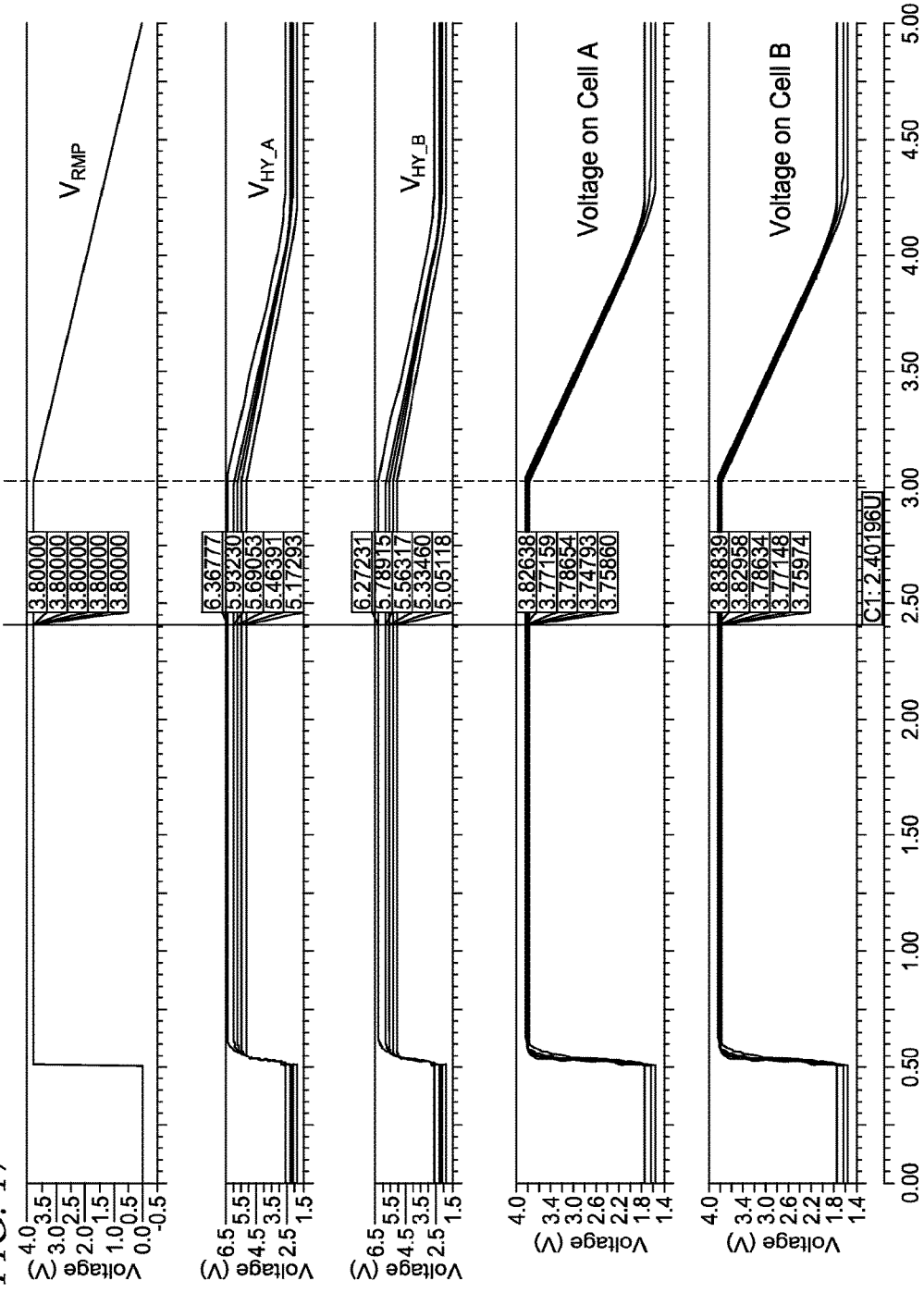
FIG. 17 illustrates simulation results of one embodiment of the invention.
Figure 18:
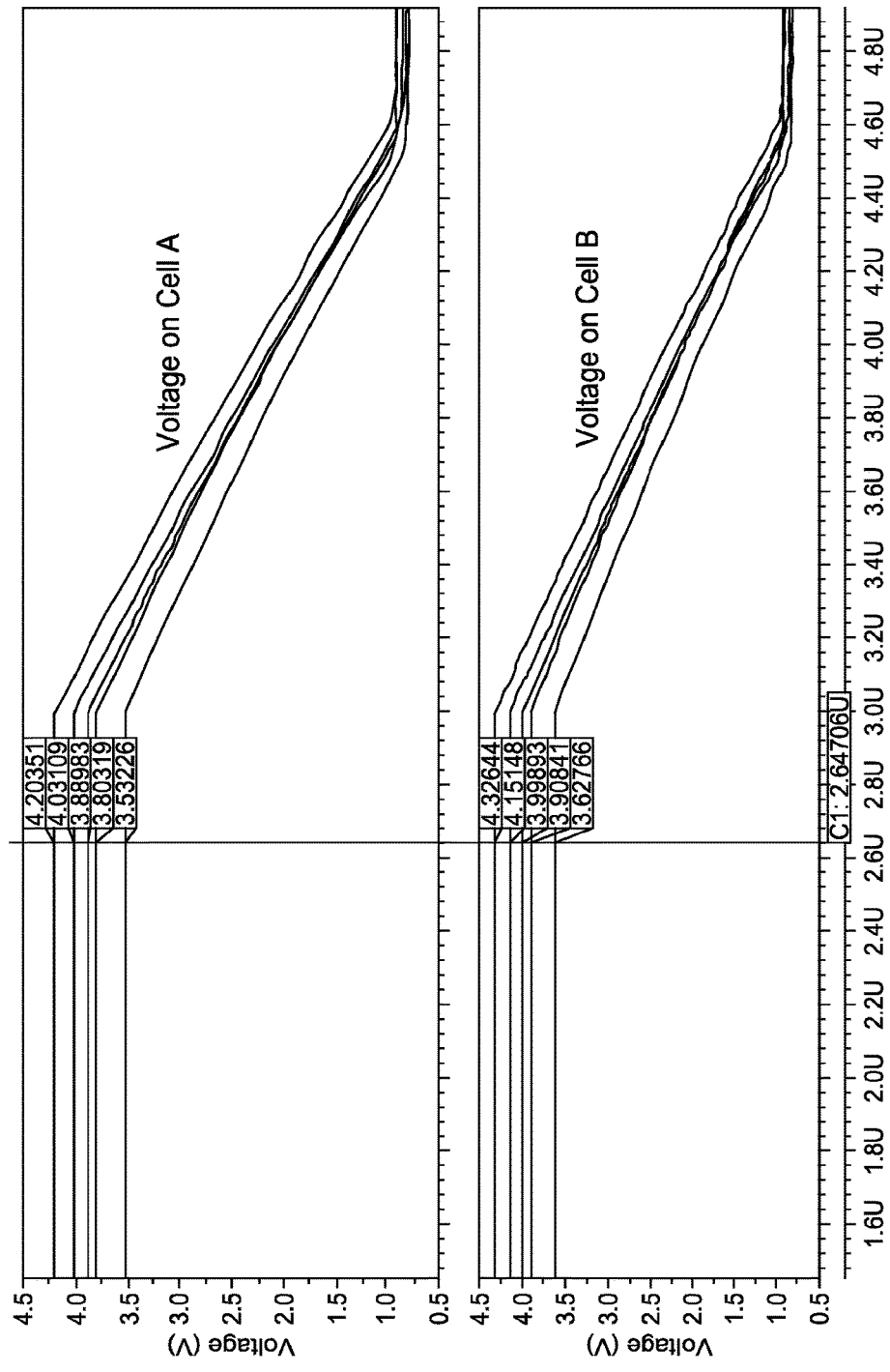
FIG. 18 illustrates simulation results of the conventional art.

FIG. 17 illustrates simulation results of one embodiment of the invention. FIG. 18 illustrates simulation results of the conventional art. In each, a voltage of 3.8 volts is the goal for the melting voltage for the cell. However, it will be understood that 3.8 volts was used just for an example and that other voltages may be applicable with cells having a different geometry or made of different material. To simulate some variability, cell B has about 1 kilohm more series resistance than cell A. In addition, cell A is simulated to be near a word line driver and cell B is simulated to be near the middle of an array. Table 1 illustrates the various temperatures and various programming models that were simulated.

TABLE 1

| Condition | Temperature (C.) | Model |
|---|---|---|
| Typical | 27 | typical |
| Slow | 85 | slow |
| Fast | −40 | fast |
| C1 | 85 | fast |
| C2 | −40 | slow |

As illustrated in FIG. 17, the programming voltages for both Cell A and Cell B for an embodiment of the invention are relatively close to the goal of 3.8 volts. For example, the voltage on Cell A ranges from 3.75 volts to 3.83 volts, and the voltage on Cell B ranges from 3.75 volts to 3.82 volts.

By contrast, the programming voltages illustrated in FIG. 18 for a conventional circuit are quite variable. For example, the voltage on Cell A ranges from 3.52 volts to 4.20 volts, and Cell B ranges from 3.62 volts to 4.30 volts.

One embodiment includes an apparatus, wherein the apparatus includes: a memory cell of an array, wherein the cell is configured to store data in at least one of a plurality of states; and a voltage generator configured to generate a programming voltage for programming the cell, wherein the voltage generator is configured to represent voltage drops encountered when programming the cell of the array, wherein the represented voltage drops include an adjustable voltage drop for representing the voltage drop of the cell.

One embodiment includes an electronically-implemented method of programming a memory cell, wherein the method includes: generating a voltage for programming a memory cell of an array with a voltage generator, wherein the cell is configured to store data in at least one of a plurality of states; and representing voltage drops encountered when programming the cell of the array in a replica circuit, wherein the represented voltage drops include an adjustable voltage drop for representing the voltage drop of the cell; wherein the generated voltage is based at least partly on the represented voltage drops.

One embodiment includes an apparatus, wherein the apparatus includes: a controller configured to issue at least one of a read operation, a write operation, a status request, or a command; and a memory device comprising: a phase-change memory (PCM) cell of a PCM array, wherein the PCM cell is configured to store data in at least one of a plurality of states, wherein the plurality of states includes at least a crystalline state and an amorphous state; and a voltage generator configured to generate a voltage for programming the PCM cell, wherein the voltage generator is configured to represent voltage drops encountered when programming the PCM cell of the PCM array, wherein the represented voltage drops include an adjustable voltage drop for representing the voltage drop of the PCM cell.

Semiconductor memory devices are ubiquitous in apparatuses such as digital electronics devices and various systems (as used herein, an "apparatus" can interchangeably refer to, for example, circuitry, a memory device or combination of memory devices, an electronic device or combination of electronic devices, or a system or combination of systems). These various systems can include a process configured to execute instructions and/or access data stored on the memory devices. Examples of apparatuses include, but are not limited to, desktop computers, workstations, servers, tablets, laptop computers, digital cameras, video cameras, digital media players, personal digital assistants, smart phones, mobile phones, navigation devices, nonvolatile storage products, kiosks, automotive products, and the like.

The foregoing description and claims may refer to elements or features as being "connected" or "coupled" together. As used herein, unless expressly stated to the contrary, "connected" means that one element/feature is directly or indirectly connected to another element/feature, and not necessarily mechanically. Likewise, unless expressly stated to the contrary, "coupled" means that one element/feature is directly or indirectly coupled to another element/feature, and not necessarily mechanically. Thus, although the drawings illustrate various examples of arrangements of elements and components, additional intervening elements, devices, features, or components may be present in an actual embodiment.

As used herein, a "node" refers to any internal or external reference point, connection point, junction, signal line, conductive element, or the like at which a given signal, logic level, voltage, data pattern, current, or quantity is present.

Various embodiments have been described above. Although described with reference to these specific embodiments, the descriptions are intended to be illustrative and are not intended to be limiting. Various modifications and applications may occur to those skilled in the art.

We claim:

1. A method of programming a memory cell, comprising:
    determining a voltage drop of a programming path to one or more memory cells of an array, the one or more memory cells each storing one or more logic states;
    determining a voltage for a voltage source based at least in part on the determined voltage drop of the programming path;
    applying a programming voltage to the one or more memory cells of the array based at least in part on the determined voltage, wherein the one or more logic states are based at least in part on a modulation of the determined voltage;
    mirroring a current received by the voltage source using a current mirroring circuit;
    transmitting a replica voltage based at least in part on voltage drops of the programming path to the one or more memory cells of the array and the mirrored current; and
    setting the programming voltage to a nonzero voltage at a first time using a source follower circuit connected to the current mirroring circuit and a voltage biasing circuit.

2. The method of claim 1, wherein the modulation of the determined voltage is based at least in part on:
    adjusting the determined voltage at a modulator; and
    applying the adjusted voltage to the one or more memory cells.

3. The method of claim 2, further comprising:
    ramping an input voltage signal received by the modulator, wherein the adjusted voltage is based at least in part on the ramped input voltage signal.

4. The method of claim 3, wherein ramping the input voltage signal comprises:
    ramping the input voltage signal at a slope less than 1 volt per 20 nanoseconds to produce a crystalline state for at least one of the one or more memory cells, or
    ramping the input voltage signal at a slope greater than 1 volt per 20 nanoseconds to produce an amorphous state for at least one of the one or more memory cells.

5. The method of claim 2, further comprising:
    setting the programming voltage to the determined voltage by short-circuiting the modulator.

6. The method of claim 1, wherein determining the voltage for the voltage source comprises:
    applying a second voltage to a replica circuit that comprises a resistance that is based at least in part on the resistance of the programming path to the one or more memory cells.

* * * * *